(12) United States Patent
Sakamoto et al.

(10) Patent No.: US 8,399,356 B2
(45) Date of Patent: Mar. 19, 2013

(54) MANUFACTURING METHOD OF SEMICONDUCTOR DEVICE

(75) Inventors: Naoya Sakamoto, Tochigi (JP); Takahiro Sato, Tochigi (JP); Yoshiaki Oikawa, Tochigi (JP); Rai Sato, Tochigi (JP); Yamato Aihara, Tochigi (JP); Takayuki Cho, Tochigi (JP); Masami Jintyou, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 843 days.

(21) Appl. No.: 12/408,375

(22) Filed: Mar. 20, 2009

(65) Prior Publication Data

US 2009/0305503 A1 Dec. 10, 2009

(30) Foreign Application Priority Data

Mar. 28, 2008 (JP) ................................. 2008-085288

(51) Int. Cl.
*H01L 21/306* (2006.01)
(52) U.S. Cl. .. 438/669; 438/618; 438/759; 257/E21.215
(58) Field of Classification Search .................. None
See application file for complete search history.

(56) References Cited

U.S. PATENT DOCUMENTS

| 5,180,689 A | 1/1993 | Liu et al. |
| 6,008,132 A | 12/1999 | Tabara |
| 6,335,290 B1 | 1/2002 | Ishida |
| 2006/0049524 A1* | 3/2006 | Lin et al. ........................ 257/750 |

FOREIGN PATENT DOCUMENTS

| JP | 63-122244 | 5/1988 |
| JP | 1-270332 | 10/1989 |
| JP | 2004-79582 | 3/2004 |

* cited by examiner

*Primary Examiner* — Seahvosh Nikmanesh
(74) *Attorney, Agent, or Firm* — Husch Blackwell LLP

(57) ABSTRACT

A conductive film containing aluminum or an aluminum alloy with a thickness equal to or greater than 1 μm and equal to or less than 10 μm is etched by wet-etching to be a predetermined thickness, and then etched by dry-etching, whereby side-etching of the conductive film can be suppressed and thickness reduction of a mask can be suppressed. The suppression of side-etching of the conductive film and the suppression of thickness reduction of the mask enable a conductive film containing aluminum or an aluminum alloy even with a large thickness equal to or greater than 1 μm and equal to or less than 10 μm to be etched such that the gradient of the edge portion of the conductive film can be steep, a predetermined thickness of the conductive film can be obtained, and shape difference from a mask pattern can be suppressed.

8 Claims, 22 Drawing Sheets

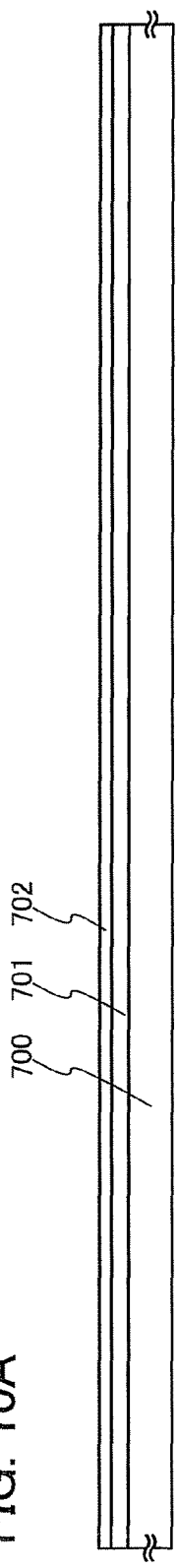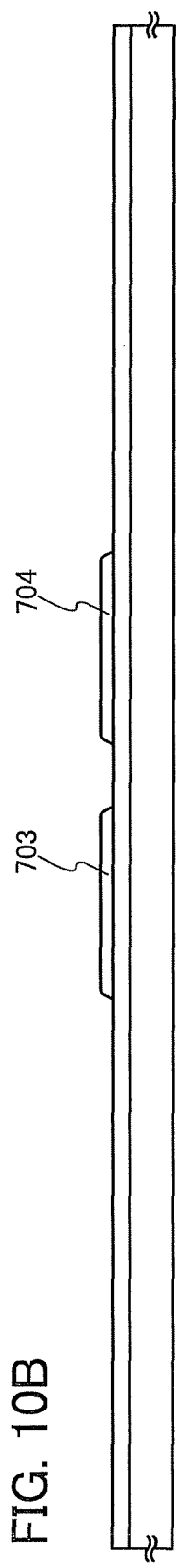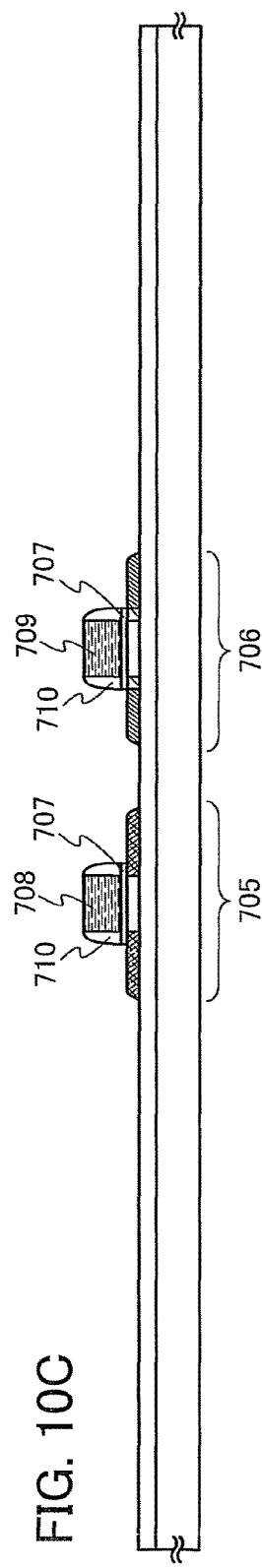

MANUFACTURING METHOD OF SEMICONDUCTOR DEVICE

BACKGROUND OF THE INVENTION

1. Field of the Invention

The present invention relates to a manufacturing method of a semiconductor device, using a method for etching a conductive film.

2. Description of the Related Art

Practical application of a technology for individual identification by wirelessly transmitting and receiving signals (RFID: radio frequency identification) has been promoted in various fields, and further expansion of the market for application of the technology is expected as a new type of data communication. RF tags are also called ID chips, wireless tags, or IC tags, and each usually have an antenna and an integrated circuit (chip). In the category of RF tags, there are a type having an external-antenna in which an integrated circuit and an antenna which are separately formed are connected and an on-chip type in which an integrated circuit and an antenna are formed over the same substrate.

RF tags tend to increase the communication distance as the resistance of the antenna is decreased, though depending on the impedance of the integrated circuit. In order to decrease the resistance of the antenna, it is important to increase the thickness of a conductive film used for the antenna, in addition to selection of the material of the conductive film.

The formation of the conductive film having a predetermined shape, such as a wiring, an electrode, or an antenna is carried out generally by a droplet discharge method such as an ink-jet method, plating method, etching method (including pattering process), or the like. Among these methods, the etching method is advantageous in that there are few limitations on selecting materials used for the conductive film and a high-definition pattern can be formed. In Japanese Published Patent Application No. 2004-79582, an etching method by which a stack wiring layer including an aluminum alloy layer with a thickness of 3 μm or more is formed to be a predetermined pattern is disclosed.

SUMMARY OF THE INVENTION

However, when a conductive film with a predetermined shape, such as a wiring, an electrode, or an antenna, is formed by etching method in the case where the conductive film is formed with a thickness of about several micrometers, the gradient of the edge portion of the conductive film is reduced due to etching of the conductive film in a direction parallel to a substrate surface (side-etching), and furthermore, the etching causes reduction in the line-width of the conductive film and reduction in the thickness of the conductive film due to disappearance of a patterning mask during the etching of the conductive film. The reduction of the gradient of the edge portion of the conductive film or the reduction in the thickness of the conductive film makes the cross-section area of the conductive film small. Therefore, even if the conductive film is formed with sufficient thickness of the conductive film to reduce the resistance of a wiring, an electrode, an antenna, or the like, it is difficult to suppress the resistance of the conductive film to be low.

Further, if the side-etching proceeds too much, the difference between the mask pattern and the shape of the conductive film after the etching becomes large, so that a conductive film having a high-definition pattern cannot be formed.

Further, in the case of a stack conductive film in which a conductive film using high-melting-point metal, called a barrier-metal film, and a conductive film using low-resistance metal such as aluminum or an aluminum alloy are stacked, the barrier-metal film is not etched or is extremely side-etched depending on the kind of etchant used for the etching.

In view of the foregoing problems, it is an object of the present invention to form a conductive film by etching such that the gradient of the edge portion can be large, a predetermined thickness can be obtained, and the difference of the shape from a mask pattern can be suppressed.

In view of the foregoing problems, it is another object of the present invention to form a conductive film having a stack structure, by etching such that the gradient of the edge portion can be large, a predetermined thickness can be obtained, the difference of shape from a mask pattern can be suppressed.

Reduction in thickness of a patterning mask can be suppressed by wet-etching while side-etching of a conductive film tends to progress, whereas side-etching of the conductive film can be suppressed to progress by dry-etching while reduction in thickness of the patterning mask tends to be increased. In consideration of the above, it has been found that side-etching of a conductive film containing aluminum or an aluminum alloy, with a thickness that is equal to or greater than 1 μm and equal to or less than 10 μm, can be suppressed and thickness reduction of a patterning mask can also be suppressed by dry-etching of the conductive film after wet-etching of the conductive film to be predetermined thickness.

The suppression of side-etching and suppression of thickness reduction of a patterning mask enable a conductive film containing aluminum or an aluminum alloy even with a large thickness as much as a thickness that is equal to or greater than 1 μm and equal to or less than 10 μm to be etched such that the gradient of the edge portion can be large, a predetermined thickness of the conductive film can be obtained, and shape difference between the etched conductive film and a predetermined mask pattern can be suppressed.

Further, a conductive film having a stack structure in which a conductive film containing aluminum or an aluminum alloy with a thickness that is equal to or greater than 1 μm and equal to or less than 10 μm, and a conductive film using a high-melting-point metal, called a barrier-metal film, are stacked is etched in a similar manner. That is, the conductive film containing aluminum or an aluminum alloy is etched by wet-etching and then is etched by dry-etching even in the following cases: the case where a barrier-metal film is formed under the conductive film containing aluminum or an aluminum alloy; the case where a barrier-metal film is formed over the conductive film containing aluminum or an aluminum alloy; and the case where barrier-metal films is formed over and under the conductive film containing aluminum or an aluminum alloy. According to the above-described method, side-etching of the conductive film can be suppressed and thickness reduction of a patterning mask can be suppressed even in the case of a conductive film having a stack structure.

The suppression of side-etching of a conductive film and suppression of thickness reduction of a patterning mask enable the conductive film even having a stack structure containing aluminum or an aluminum alloy with a large thickness as much as a thickness that is equal to or greater than 1 μm and equal to or less than 10 μm to be etched such that the gradient of the edge portion of the conductive film can be large, a predetermined thickness of the conductive film can be obtained, and shape difference between the etched conductive film and a mask pattern can be suppressed. In this specification, the "side-etching" means etching of a film in a direction parallel to a substrate surface. In addition, the amount of side-etching is measured by the distance from the edge portion of an opening of a patterning mask before an etching process to the edge portion of the film after the etching in a direction parallel to the substrate surface.

One embodiment of the effect of the present invention is that a conductive film having a high-definition pattern can be obtained with the result that the gradient of the edge portion of the conductive film can be steep, a predetermined thickness o the conductive film can be obtained, and the shape difference between the conductive film and a mask pattern can be suppressed by the etching. Accordingly, the resistance of the conductive film after the etching can be suppressed.

BRIEF DESCRIPTION OF THE DRAWINGS

FIGS. 10A to 10C illustrate a manufacturing method of a semiconductor device, according to the embodiment of the present invention.

FIGS. 22A and 22B are a SEM image in a cross section of Sample after wet-etching and a SEM image in the cross section of Sample after dry-etching.

DETAILED DESCRIPTION OF THE INVENTION

Hereinafter, embodiments of the present invention will be described using drawings. However, the present invention may be embodied in a lot of different forms, and it is to be easily understood that various changes and modifications will be apparent to those skilled in the art unless such changes and modifications depart from the spirit and scope of the present invention. Therefore, the present invention is not to be construed with limitation to the description in the embodiments.

The present invention can be applied to manufacture of any kind of semiconductor devices including microprocessors, integrated circuits such as image processing circuits, RF tags, and semiconductor display devices. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and other semiconductor display devices having a driver circuit including a circuit element using a conductive film.

Embodiment 1

In this embodiment, etching of a conductive film, involved in the method for manufacturing a semiconductor device will be described.

Figure 1A:
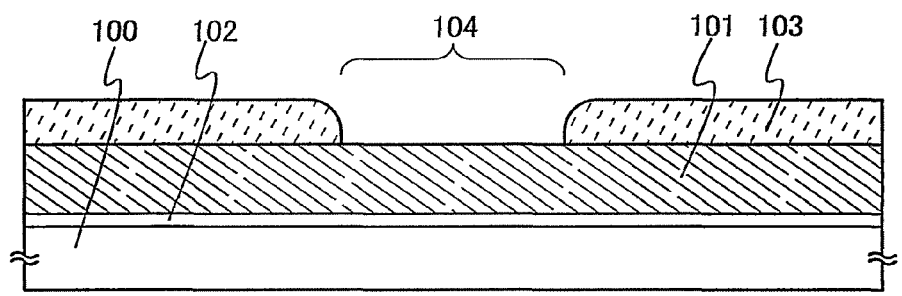
FIGS. 1A to 1C illustrate a manufacturing method of a semiconductor device, according to an embodiment of the present invention.

First, as shown in FIG. 1A, a conductive film 101 containing aluminum or an aluminum alloy is formed to have a thickness equal to or greater than 1 μm and equal to or less than 10 μm, preferably a thickness equal to or greater than 2 μm and equal to or less than 6 μm, over an insulating surface. FIG. 1A illustrates the case where an insulating film 102 is formed over a substrate 100 and the conductive film 101 is formed over the insulating film 102. The conductive film 101 containing aluminum or an aluminum alloy can be formed by a sputtering method, a CVD method, or the like.

Then, using a resist, a mask 103 having an opening 104 is formed over the conductive film 101. As the mask 103 is formed with increasing in the thickness, it can take more time to make the mask 103 completely disappear in dry-etching next performed, so that etching of the top surface of the conductive film 101 due to disappearance of the mask 103 can be prevented. However, too much increase in the thickness of the mask 103 causes decrease of the resolution of the mask 103, so that it becomes difficult to form a conductive film having a high-definition pattern. Therefore, for example, when the minimum distance between the masks 103, that is, the minimum width of the opening 104 before an etching process, is several micrometers, it is preferable to set the maximum thickness of the mask 103 at about 3 μm.

Figure 1B:
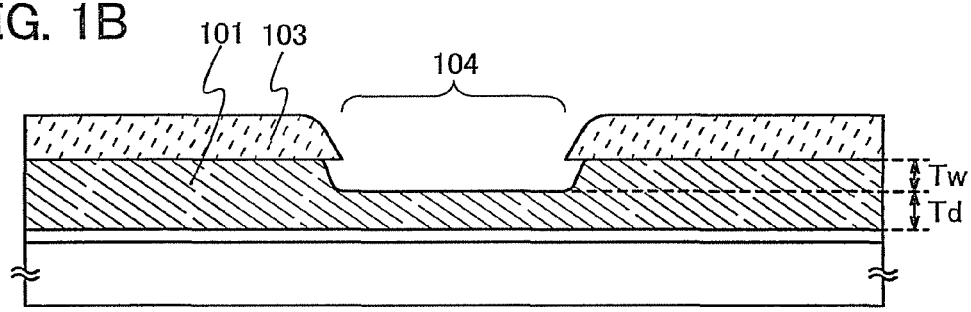

Next, as shown in FIG. 1B, the conductive film 101 is etched by wet etching such that the part of the conductive film 101, directly below the opening 104, remains to some degree. The thickness of the conductive film 101 which is etched off by the wet-etching, which is denoted by Tw, is determined by the thickness of the conductive film 101 which is etched off by dry etching next performed, which is denoted by Td. The thickness Td of the conductive film 101 which is etched off by the dry etching, is set to be equal to or greater than 0.5 µm and equal to or less than 90 percent of the thickness of the conductive film 101 before the etching process. However, in the case where the thickness of the conductive film 101 before the etching process is too thick, etching-off of all of the conductive film 101 with a thickness of 90 percent of that before the etching process might cause disappearance of the mask 103 in dry-etching. Therefore, in the case where the thickness of the conductive film 101 before the etching process is large, the maximum value of the thickness Td is set such that the mask 103 with the maximum thickness assuring a predetermined resolution can remain at least partly. Specifically, when the thickness of the mask 103 is 3 µm, it is preferable to set the maximum value of the thickness Td at about 5 µm, more preferably about 3 µm.

By the wet etching, as shown in FIG. 1B, a depressed portion which is opened toward the mask is formed in the conductive film 101 directly below the opening 104 of the mask 103.

Figure 1C:
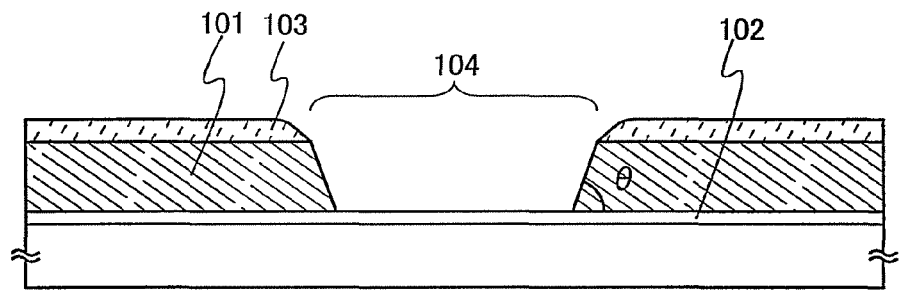

Next, as shown in FIG. 1C, the conductive film 101 is further etched by dry etching so that a part of a surface of the insulating film 102, directly below the opening 104 of the mask 103, is exposed. FIG. 1C illustrates the case where the insulating film 102 is formed as the base film with respect to the conductive film 101; thus, the insulating film 102 is partly exposed by the dry etching.

As for the mask 103, the thickness and area tend to be decreased as compared to those before the etching process. However, in this embodiment, since the maximum value of the thickness Td is determined in accordance with the thickness of the mask 103 before the etching process, disappearance of the mask 103 by the dry etching can be prevented.

With the dry etching performed after the wet etching, the conductive film 101 can be obtained such that the gradient of the edge portion of the conductive film 101 can be steep, specifically such that a taper angle θ formed between the surface of the conductive film 101 at the edge portion and the top surface of the insulating film 102, which is the base film, can be equal to or greater than 50° and equal to or less than 90°, equal to or greater than 60° and equal to or less than 90°. Further, as compared to the case where only wet-etching is performed, side-etching of the conductive film 101 can be suppressed, whereby the conductive film 101 can be formed having high definition with less shape difference between the etched conductive film 101 and the pattern of the mask 103. Further, since the disappearance of the mask 103 by dry etching is prevented, the conductive film 101 etched by the dry-etching can have a predetermined thickness.

FIGS. 1A to 1C illustrate the case where a single layer of the conductive film 101 containing aluminum or an aluminum alloy is used; however, according to this embodiment, a conductive film having a stack structure in which a conductive film containing aluminum or an aluminum alloy and a conductive film using a high-melting-point metal, called a barrier-metal film, are stacked can also be etched in a similar manner.

Etching of a conductive film 106 having a stack structure in which the conductive film 101 containing aluminum or an aluminum alloy is stacked on a barrier-metal film 105 will be described using FIGS. 2A to 2C.

Figure 2A:
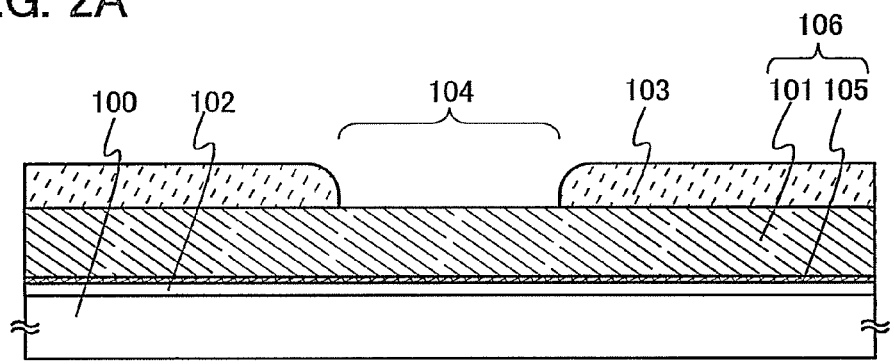
FIGS. 2A to 2C illustrate a manufacturing method of a semiconductor device, according to an embodiment of the present invention.

First, as shown in FIG. 2A, the barrier-metal film 105 is formed over an insulating surface to have a thickness equal to or greater than 50 nm and equal to or less than 300 nm, and then the conductive film 101 containing aluminum or an aluminum alloy is formed with a thickness equal to or greater than 1 µm and equal to or less than 10 µm, preferably a thickness equal to or greater than 2 µm and equal to or less than 6 µm, thereby forming the conductive film 106 having the stack structure. FIG. 2A illustrates the case where the insulating film 102 is formed over the substrate 100, and the barrier-metal film 105 and the conductive film 101 are formed over the insulating film 102 in this order. The barrier-metal film 105 can be formed by a sputtering method, a CVD method, or the like as is the case for the conductive film 101.

The barrier-metal film 105 can be formed using a high-melting-point metal such as titanium (Ti), tantalum (Ta), tungsten (W), or molybdenum (Mo), a nitride of the high-melting-point metal, or the like.

Then, as is the case shown in FIG. 1A, using a resist, the mask 103 having the opening 104 is formed over the conductive film 106.

Figure 2B:
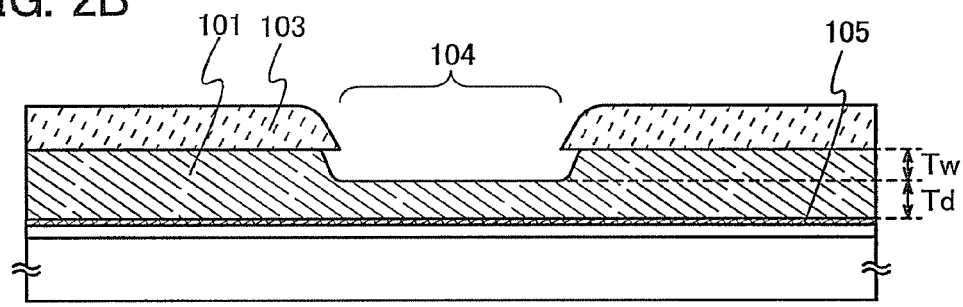

Next, as shown in FIG. 2B, the conductive film 101 is etched by wet etching such that the part of the conductive film 101, directly below the opening 104, remains to some degree. By the wet etching, a depressed portion which is opened toward the mask is formed in the conductive film 101 directly below the opening 104 of the mask 103. Since the conductive film 101 is etched off by thickness Tw by wet etching, the barrier-metal film 105 remains to be covered with the conductive film 101.

The thickness Tw of the conductive film 101 which is etched off by the wet-etching is determined by the thickness Td of the conductive film 101 which is etched off by dry-etching next performed. The thickness Td of the conductive film 101 which is etched off by the dry-etching is set to be equal to or greater than 0.5 µm and equal to or less than 90 percent of the thickness of the conductive film 101 before an etching process. However, in the case where the thickness of the conductive film 101 before the etching process is too large, etching-off of all of the barrier-metal film 105 and the conductive film 101 with a thickness of 90 percent of that before the etching process might cause disappearance of the mask 103 in the dry-etching. Therefore, in the case where the thickness of the conductive film 101 before the etching process is large, the maximum value of the thickness Td is set such that the mask 103 with the maximum thickness assuring a predetermined resolution can remain at least partly, considering the thickness of the barrier-metal film 105. Specifically, when the thickness of the mask 103 is 3 µm, it is preferable to set the maximum value of the thickness Td at about 5 µm, more preferably about 3 µm.

Figure 2C:
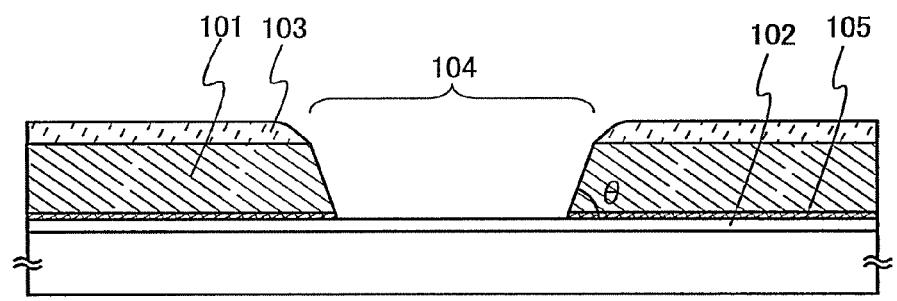

Next, as shown in FIG. 2C, the conductive film 101 with the thickness Td and the barrier-metal film 105 are etched by dry-etching so that a part of a surface of the insulating film 102, directly below the opening 104 of the mask 103 is exposed. FIG. 2C illustrates the case where the insulating film 102 is formed as the base film with respect to the conductive film 101; thus, the insulating film 102 is partly exposed by the dry etching.

As for the mask 103, the thickness and area tend to be decreased as compared to those before the etching process. However, in this embodiment, since the maximum value of the thickness Td is determined in accordance with the thickness of the mask 103 before the etching process, disappearance of the mask 103 by the dry-etching can be prevented.

With the dry etching performed after the wet etching, the conductive film 106 having the stack structure can be obtained such that the gradient of the edge portion of the conductive film 106 can be large, specifically such that a taper angle θ formed between the surface of the conductive film 106 at the edge portion and the top surface of the insulating film 102 as the base film can be equal to or greater than 50° and equal to or less than 90°, preferably equal to or greater than 60° and equal to or less than 90°. Further, as compared to the case where only wet etching is performed, side etching can be suppressed, whereby the conductive film 106 having the stack structure can be obtained having high definition with less shape difference between the etched conductive film 106 and the pattern of the mask 103. Further, since the disappearance of the mask 103 by dry etching is prevented, the conductive film 106 can have a predetermined thickness.

Etching of a conductive film 108 having a stack structure in which the barrier-metal film 105, the conductive film 101 containing aluminum or an aluminum alloy, and a barrier-metal film 107 are stacked in this order will be described using FIGS. 3A to 3C.

Figure 3A:
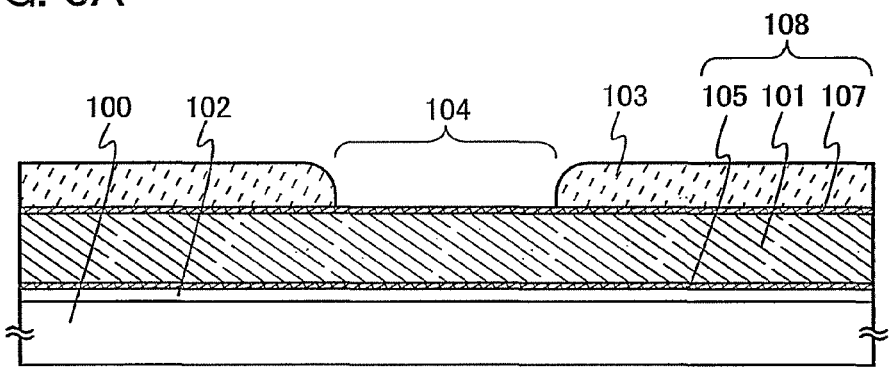
FIGS. 3A to 3C illustrate a manufacturing method of a semiconductor device, according to an embodiment of the present invention.

First, as shown in FIG. 3A, the barrier-metal film 105 is formed over an insulating surface with a thickness equal to or greater than 50 nm and equal to or less than 300 nm, and then the conductive film 101 containing aluminum or an aluminum alloy is formed with a thickness equal to or greater than 1 μm and equal to or less than 10 μm, preferably a thickness equal to or greater than 2 μm and equal to or less than 6 μm. Then, the barrier metal film 107 is formed over the conductive film 101 with a thickness equal to or greater than 50 nm and equal to or less than 300 nm, thereby forming the conductive film 108 having the stack structure. FIG. 3A illustrates the case where the insulating film 102 is formed over the substrate 100 and the barrier metal film 105, the conductive film 101, and the barrier metal film 107 are formed over the insulating film 102 in this order. The barrier metal films 105 and 107 each can be formed by a sputtering method, a CVD method, or the like as is the case for the conductive film 101.

The barrier metal films 105 and 107 each can be formed using a high-melting-point metal such as titanium (Ti), tantalum (Ta), tungsten (W), or molybdenum (Mo), a nitride of the high-melng 104 is formed over the conductive film 108.

Figure 3B:
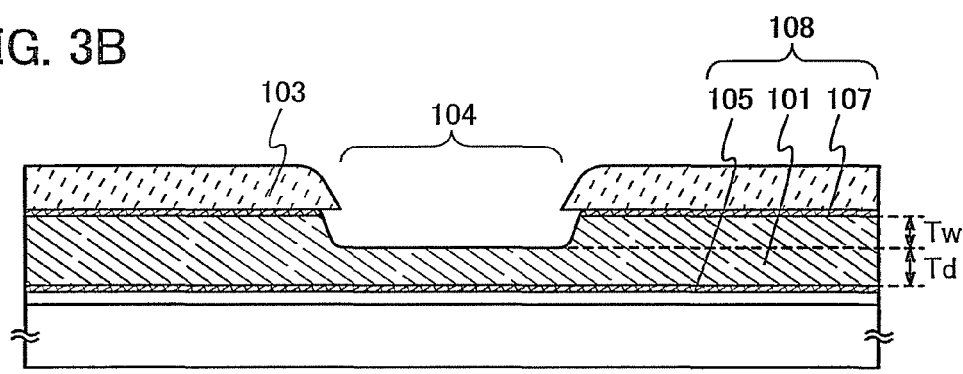

Next, as shown in FIG. 3B, by wet-etching, the barrier-metal film 107 is etched, and then the conductive film 101 is etched such that the part of the conductive film 101, directly below the opening 104, remains to some degree. By the wet etching, a depressed portion which is opened toward the mask is formed in the conductive film 101 directly below the opening 104 of the mask 103. Since the conductive film 101 is etched off by the thickness Tw by the wet-etching, the barrier-metal film 105 remains to be covered with the conductive film 101.

The thickness Tw of the conductive film 101 which is etched off by the wet-etching is determined by the thickness Td of the conductive film 101 which is etched off by dry-etching next performed. The thickness Td of the conductive film 101 which is etched off by the dry-etching is set to be equal to or greater than 0.5 μm and equal to or less than 90 percent of the thickness of the conductive film 101 before an etching process. However, in the case where the thickness of the conductive film 101 before the etching process is too large, etching-off of all of the barrier-metal film 105 and the conductive film 101 with a thickness of 90 percent of that before the etching process might cause disappearance of the mask 103 in the dry-etching process. Therefore, in the case where the thickness of the conductive film 101 before the etching process is large, the maximum value of the thickness Td is set such that the mask 103 with the maximum thickness assuring a predetermined resolution can remain at least partly, considering the thickness of the barrier-metal film 105. Specifically, when the thickness of the mask 103 is 3 μm, it is preferable to set the maximum value of the thickness Td at about 5 μm, more preferably about 3 μm.

Figure 3C:
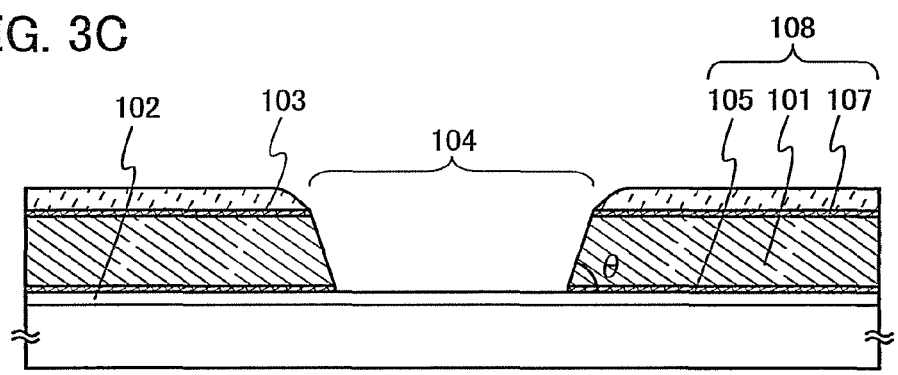

Next, as shown in FIG. 3C, the conductive film 101 with the thickness Td and the barrier-metal film 105 are etched by dry-etching so that a part of a surface of the insulating film 102, directly below the opening 104 of the mask 103, is exposed. FIG. 3C illustrates the case where the insulating film 102 is formed as the base film with respect to the conductive film 101; thus, the insulating film 102 is partly exposed by the dry-etching.

As for the mask 103, the thickness and area tend to be decreased as compared to those before the etching process. However, in this embodiment, since the maximum value of the thickness Td is determined in accordance with the thickness of the mask 103 before the etching process, disappearance of the mask 103 by the dry-etching can be prevented.

With the dry-etching performed after the wet-etching, the conductive film 108 having the stack structure can be obtained such that the gradient of the edge portion of the conductive film 108 can be large, specifically such that a taper angle θ formed between the surface of the conductive film 108 at the edge portion and the top surface of the insulating film 102 as a base film can be equal to or greater than 50° and equal to or less than 90°, preferably equal to or greater than 60° and equal to or less than 90°. Further, as compared to the case where only wet-etching is performed, side-etching of the conductive film 108 can be suppressed, whereby the conductive film 108 having the stack structure can be obtained having high definition with less shape difference from the pattern of the mask 103. Further, since the disappearance of the mask 103 by dry-etching is prevented, the conductive film 108 can have a predetermined thickness.

Embodiment 2

In this embodiment, the cross-sectional shape of the conductive film which was processed (patterned) into a desired shape by performing wet-etching and dry-etching in this order will be described.

First, the method for forming samples before an etching process will be described. Used as samples were Sample A and Sample C each in which a barrier-metal film and a conductive film were stacked in this order, and Sample B in which a barrier-metal film, a conductive film, and a barrier-metal film were stacked in this order.

Specifically, Sample A was formed as follows: an insulating film was formed using polyimide over a glass substrate, and a 100-nm titanium film and a 5 μm aluminum film were stacked in this order by a sputtering method, so that a conductive film having a two-layer structure was formed. Sample B was formed as follows: an insulating film was formed using polyimide over a glass substrate, and a 100-nm titanium film, a 5-μm aluminum film, and a 100-nm titanium film were stacked in this order by a sputtering method, so that a conductive film having a three-layer structure was formed. Sample C was formed as follows: an insulating film was formed using polyimide over a glass substrate, and a 100-nm titanium film and a 4-μm aluminum film were stacked in this order by a sputtering method, so that a conductive film having a two-layer structure was formed.

Then, in each of Samples A, B, and C, a mask with a thickness of about 2.5 μm having a predetermined pattern was formed using a resist over the conductive film having the stack structure. A positive resist (TFR-1000H, manufactured by TOKYO OHKA KOGYO CO., LTD) was used as the resist.

The wet-etching was performed by spraying, as an etchant, an aqueous solution containing ammonium fluoride at less than 1% and nitric acid at less than 5%, which is obtained by diluting KSMF-230/5 (trade name) manufactured by TOKYO OHKA KOGYO CO., LTD with water, on samples at a pressure of 0.1 MPa and a solution temperature of 45° C.

The dry-etching was performed by an ICP etching method using a mixed gas of chlorine and boron trichloride as an etching gas. Specifically, the dry-etching was performed changing the setting condition of the dry-etching on the way of the process, as follows. First, the condition of the dry-etching is set such that the flow rate of chlorine and the flow rate of boron trichloride, both the gases are included in the etching gas, are 250 sccm and 650 sccm, the reaction pressure is 2.0 Pa, the temperature of the lower electrode is 20° C., the RF (13.56 MHz) power which is supplied to a coil-electrode is 0 W, and the power which is supplied to the lower electrode (on the bias side) is 1500 W. Second, the condition of the dry-etching is set such that the flow rate of chlorine and the flow rate of boron trichloride, both the gases are included in the etching gas, are 100 sccm and 700 sccm, the reaction pressure is 2.0 Pa, the temperature of the lower electrode is 21° C., the RF (13.56 MHz) power which is supplied to the coil-electrode is 0 W, and the power which is supplied to the lower electrode (on the bias side) is 750 W.

Figure 4A:
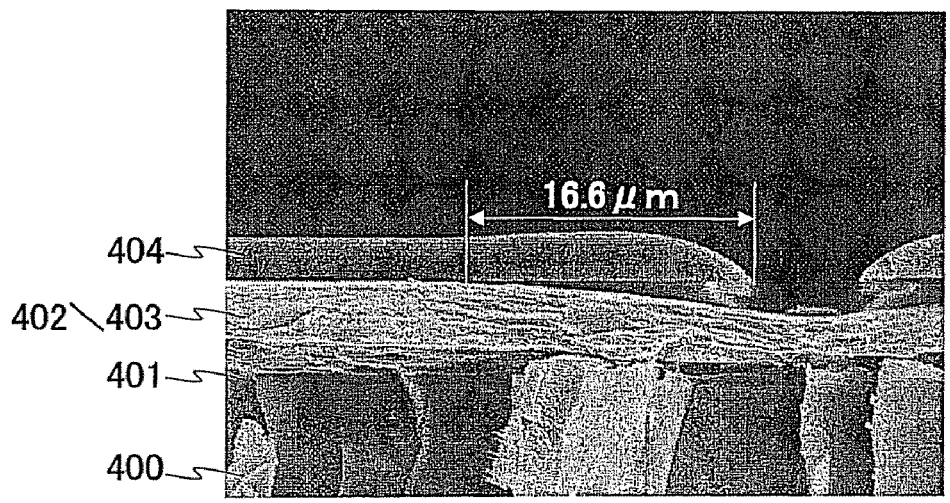
FIGS. 4A and 4B are a SEM image of a cross section of Sample A after wet-etching and a SEM image of the cross section of Sample A after dry-etching.

FIG. 4A shows a SEM image at 3000-fold magnification of the cross section of Sample A after the wet-etching, taken by a scanning electron microscope. It is found from FIG. 4A that an insulating film 401 formed using polyimide is on a substrate 400, and a titanium film 402, an aluminum film 403, and a mask 404 are stacked in this order on the insulating film 401. In Sample A after the wet-etching, it is found that the part of the aluminum film 403, directly below an opening of the mask 404, is etched off by a depth of about 1.96 µm. In addition, it is found that the aluminum film 403 is side-etched off by about 16.6 µm from the edge portion of the opening of the mask 404 by the wet-etching.

Figure 4B:
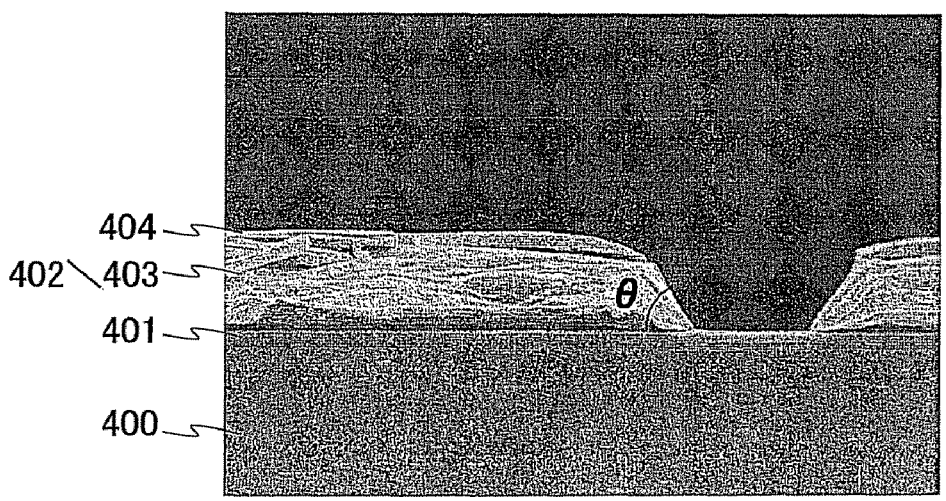

FIG. 4B shows a SEM image at 3000-fold magnification of the cross section of Sample A after the dry-etching performed on the state of FIG. 4A, taken by a scanning electron microscope. As is seen from FIG. 4B, in Sample A after the dry-etching, it is found that the parts of the aluminum film 403 and the titanium film 402, directly below the opening of the mask 404 is removed to expose part of the insulating film 401. In addition, in Sample A after the dry-etching, it is found that the thickness of the mask 404 is smaller than that of the FIG. 4A and the mask 404 is remained with a thickness of about 0.7 µm on the aluminum film 403. In addition, it is found that at the edge portion of the conductive film including the titanium film 402 and the aluminum film 403, the taper angle θ formed between the surface of the conductive film and the top surface of the insulating film 401 is about 58°.

Figure 5A:
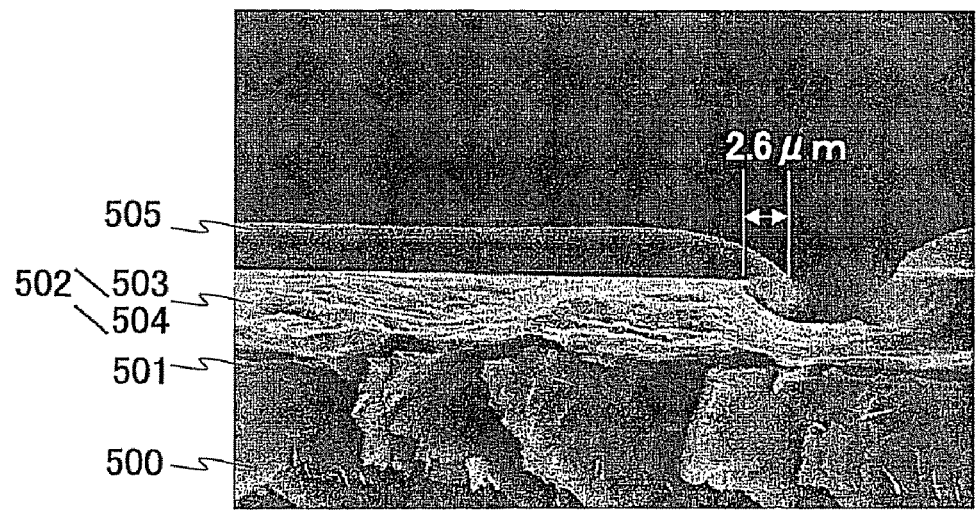
FIGS. 5A and 5B are a SEM image of a cross section of Sample B after wet-etching and a SEM image of a cross section of Sample B after dry-etching.

FIG. 5A shows a SEM image at 3000-fold magnification of the cross section of Sample B after the wet-etching, taken by a scanning electron microscope. It is found from FIG. 5A that an insulating film 501 formed using polyimide is on a substrate 500, and a titanium film 502, an aluminum film 503, a titanium film 504, and a mask 505 are stacked in this order on the insulating film 501. In Sample B after the wet-etching, it is found that parts of the titanium film 504 and the aluminum film 503, directly below an opening of the mask 505, are etched off by a total depth of about 2.55 µm. In addition, it is found that the titanium film 504 and the aluminum film 503 are side-etched off by about 2.6 µm from the edge portion of the opening of the mask 505 by the wet-etching.

Figure 5B:
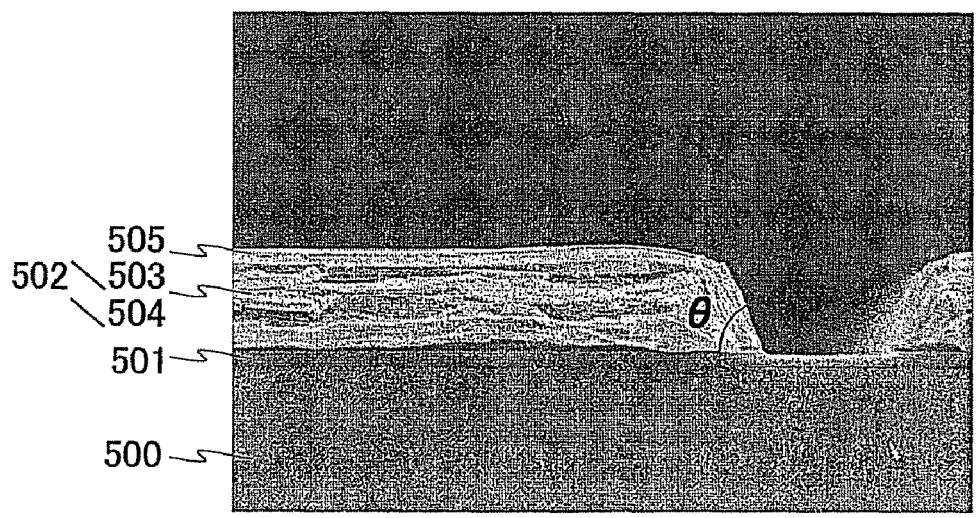

FIG. 5B shows a SEM image at 3000-fold magnification of the cross section of Sample B after the dry-etching performed on the state of FIG. 5A, taken by a scanning electron microscope. As is seen from FIG. 5B, in Sample B after the dry-etching, it is found that the remaining parts of the aluminum film 503 and the titanium film 202, directly below the opening of the mask 505, are removed to expose part of the insulating film 501. In addition, in Sample B after the dry-etching, it is found that the mask 505 has a thickness as small as the thickness beyond measure and the mask 505 remains on the aluminum film 503. In addition, it is found that at the edge portion of the conductive film including the titanium film 502, the aluminum film 503, and the titanium film 504, the taper angle θ formed between the surface of the conductive film and the top surface of the insulating film 501 is about 66°.

As shown in FIG. 4B, since Sample A was side-etched off by the wet-etching by the amount larger than that of Sample B, there was a space between the mask 404 and the aluminum film 403 after the dry-etching. On the other hand, as shown in FIG. 5B, since Sample B was side-etched off by the wet-etching by the amount smaller than that of Sample A, a space was not easily formed between the mask 505 and the aluminum film 503 after the dry-etching. This suggests that an adhesion of the barrier-metal film to the mask is higher than that of the conductive film containing aluminum or an aluminum alloy to the mask. Therefore, by using the conductive film in which the barrier-metal film is stacked on the conductive film containing aluminum or an aluminum alloy, side-etching of the conductive film can be suppressed, so that the taper angle θ can be large and a high-definition conductive film having a stack structure with less shape difference the etched conductive film and the pattern of a mask can be formed.

Next, for comparison, cross-sectional shapes of the conductive films of Sample A and Sample B after patterning was performed only by wet-etching will be described. The condition of the wet-etching was the same as those of FIGS. 4A and 4B and FIGS. 5A and 5B.

Figure 6A:
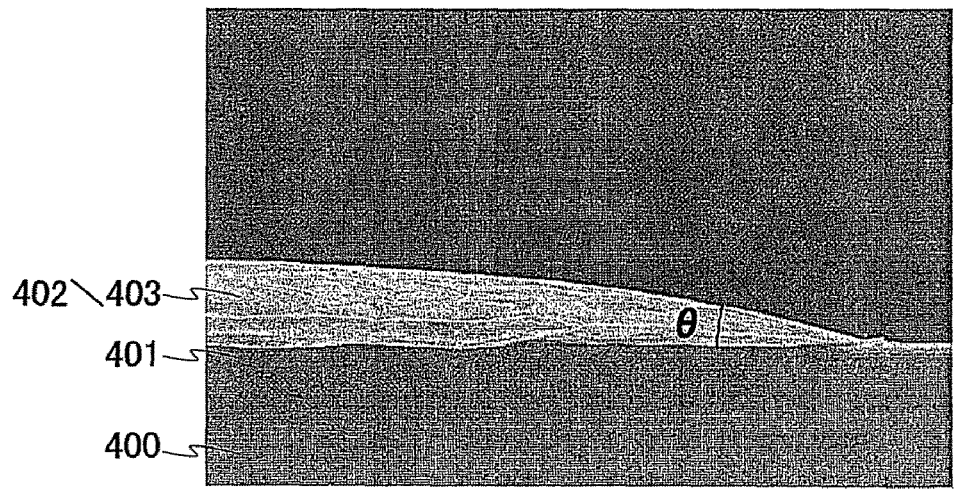
FIGS. 6A and 6B are a SEM image of a cross section of Sample A after wet-etching and a SEM image of a cross section of Sample B after wet-etching.

FIG. 6A shows a SEM image at 3000-fold magnification of the cross section of Sample A after the wet-etching, taken by a scanning electron microscope. It is found from FIG. 6A that the insulating film 401 ise-etching of the aluminum film 403 proceeded too much, so that the mask 404 peeled off and disappeared. In FIG. 6A, it is found that at the edge portion of the conductive film including the titanium film 402 and the aluminum film 403 in Sample A, the taper angle θ formed between the surface of the conductive film and the top surface of the insulating film 401 is about 15°.

Figure 6B:
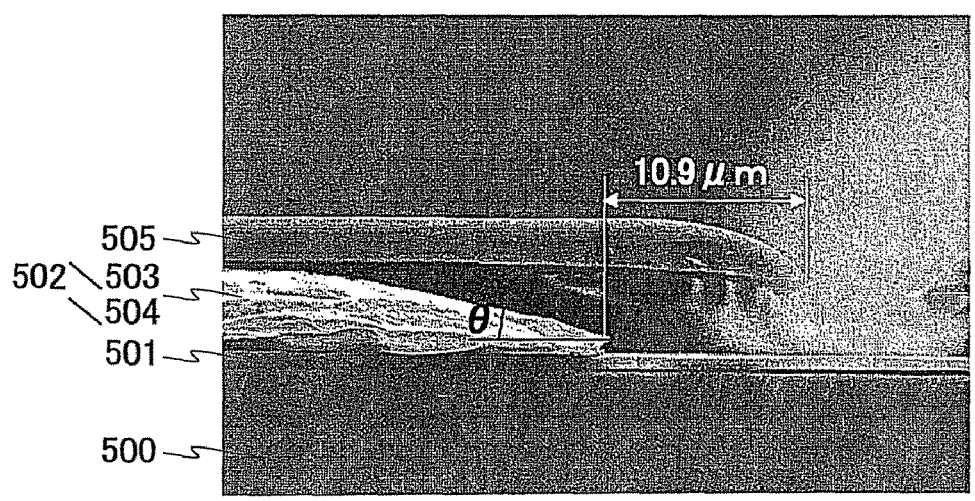

FIG. 6B shows a SEM image at 3000-fold magnification of the cross section of Sample B after the wet-etching, taken by a scanning electron microscope. It is found from FIG. 6B that the insulating film 501 is partly exposed by removing parts of the titanium film 504, the aluminum film 503, and the titanium film 502. In addition, in FIG. 6B, while a part of the mask 505 remains, side-etching of the conductive film including the titanium film 502, the aluminum film 503, and the titanium film 504 has been proceeded, so that the conductive film is removed completely by about 10.9 µm from the edge portion of the opening of the mask 505 to the exposed part of the insulating film 501. In FIG. 6B, it is found that at the edge portion of the conductive film including the titanium film 502, the aluminum film 503, and the titanium film 504 in Sample B, the taper angle θ formed between the surface of the conductive film and the top surface of the insulating film 501 is about 13°.

From the comparison of the FIGS. 4A, 4B, 5A, and 5B and FIGS. 6A and 6B, it is found that the compared to the case of etching only by wet-etching, side-etching of the conductive film can be suppressed by etching the conductive film to a predetermined thickness by wet-etching and then etching the rest by dry-etching as described in Embodiment 1. Accordingly, it is found that the method for etching a conductive film described in Embodiment 1 enables the conductive film to be etched so that the gradient of the edge portion is steep, and the conductive film has a predetermined thickness and less shape difference from a mask pattern.

Next, for comparison, cross-sectional shapes of the conductive films of Sample A and Sample B after patterning was performed by dry-etching and wet-etching in this order will be described. The conditions of the wet-etching and the dry-etching were the same as those of FIGS. 4A and 4B and FIGS. 5A and 5B.

Figure 7A:
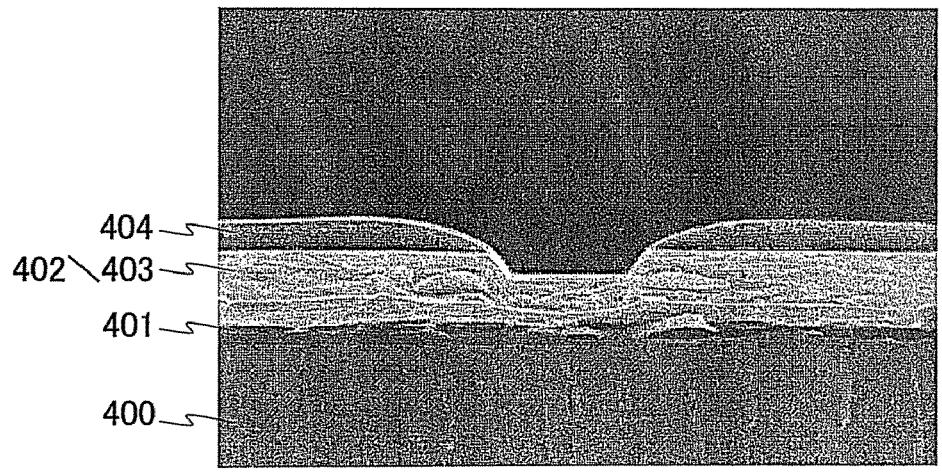
FIGS. 7A and 7B are a SEM image of a cross section of Sample A after dry-etching and a SEM image of a cross section of Sample A after wet-etching.

FIG. 7A shows a SEM image at 3000-fold magnification of the cross section of Sample A after the dry-etching, taken by a scanning electron microscope. It is found from FIG. 7A that the part of the aluminum film 403, directly below the opening of the mask 404, has been etched off by a depth of about 1.3 µm.

Figure 7B:
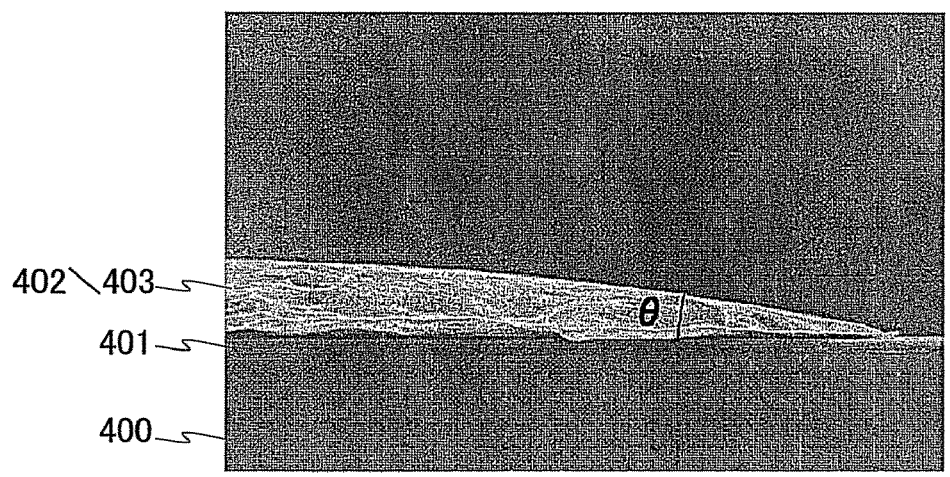

FIG. 7B shows a SEM image at 3000-fold magnification of the cross section of Sample A after the wet-etching was performed on the state of FIG. 7A, taken by a scanning electron microscope. In Sample A after the wet-etching, it is found that the insulating film 401 is partly exposed by removing parts of the aluminum film 403 and the titanium film 402. In addition, in FIG. 7B, it is found that the side-etching proceeded too much, so that the mask 404 peeled and disappeared in Sample A after the wet-etching. In FIG. 7B, it is found that at the edge portion of the conductive film including the titanium film 402 and the aluminum film 403 in Sample A, the taper angle θ formed between the surface of the conductive film and the top surface of the insulating film 401 is about 11°.

Figure 8A:
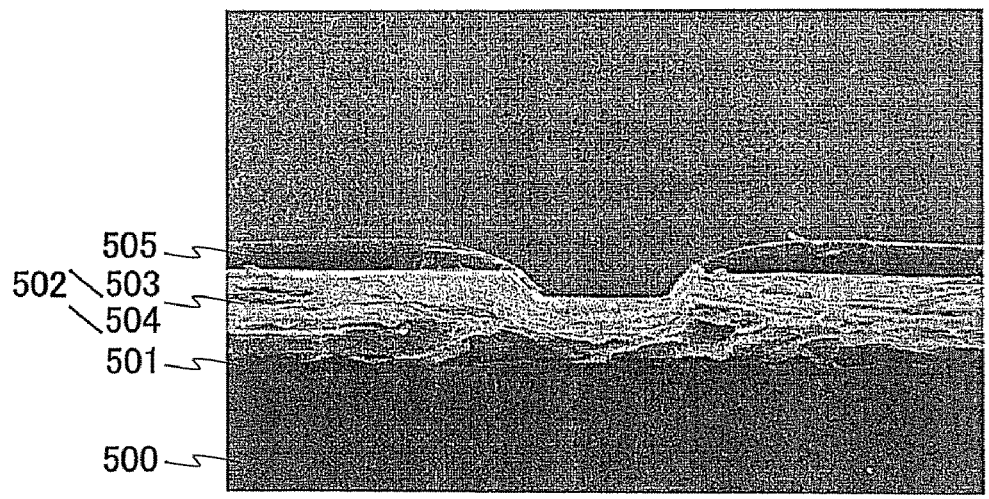
FIGS. 8A and 8B are a SEM image of a cross section of Sample B after dry-etching and a SEM image of the cross section of Sample B after wet-etching.

FIG. 8A shows a SEM image at 3000-fold magnification of the cross section of Sample B after the dry-etching, taken by a scanning electron microscope. It is found from FIG. 8A that the parts of the titanium film 504 and the aluminum film 503, directly below the opening of the mask 505, have been etched off by a total depth of about 1.5 µm in Sample B by the dry-etching.

Figure 8B:
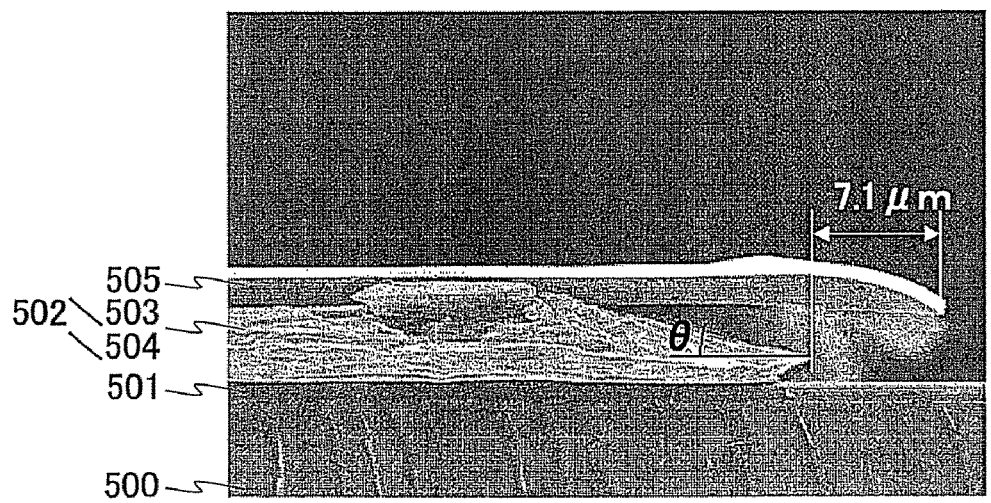

FIG. 8B shows a SEM image at 3000-fold magnification of the cross section of Sample B after the wet-etching was performed on the state of FIG. 8A, taken by a scanning electron microscope. In Sample B after the wet-etching, it is found that the insulating film 501 is partly exposed by removing the remaining parts of the titanium film 504, the aluminum film 503, and the titanium film 502. In addition, in FIG. 8B, it is found that while part of the mask 505 remains, side-etching of the conductive film including the titanium film 502, the aluminum film 503, and the titanium film 504 proceeded, so that the conductive film has been removed completely by about 7.1 µm from the edge portion of the opening of the mask 505 to exposed part of the insulating film 501. In FIG. 8B, in Sample B, it is found that the surface of the aluminum film 503 at the edge portion is not smooth but sharp-pointed. In FIG. 8B, in Sample B, it is found that the taper angle θ formed between the top surface of the insulating film 501 and the sloping surface from the tip of the sharp point at the edge portion of the aluminum film 503 to the edge portion of the titanium film 504 is about 14°.

From the comparison of the FIGS. 4A, 4B, 5A, and 5B and FIGS. 7A, 7B, 8A, and 8B, it is found that the side-etching of the conductive film can be suppressed by etching the conductive film to be a predetermined thickness by wet-etching and then etching the rest by dry-etching as described in Embodiment 1 compared to the case of etching by dry-etching and wet-etching in this order. Further, from the comparison of the FIGS. 5A, and 5B and FIGS. 8A, and 8B, it is found that the edge portion of the conductive film can be prevented from being sharp-pointed by etching the conductive film to be a predetermined thickness by wet-etching and then etching the rest by dry-etching as described in Embodiment 1 compared to the case of etching by dry-etching and wet-etching in this order. Accordingly, it is found that the method for etching a conductive film described in Embodiment 1 enables the conductive film to be etched so that the gradient of the edge portion is steep, and the conductive film has a predetermined thickness and less shape difference from a mask pattern.

Next, for comparison, a cross-sectional shape of the conductive film of Sample C after patterning was performed only by dry-etching will be described. The condition of the dry-etching was the same as those of FIGS. 4A and 4B and FIGS. 5A and 5B.

Figure 9:
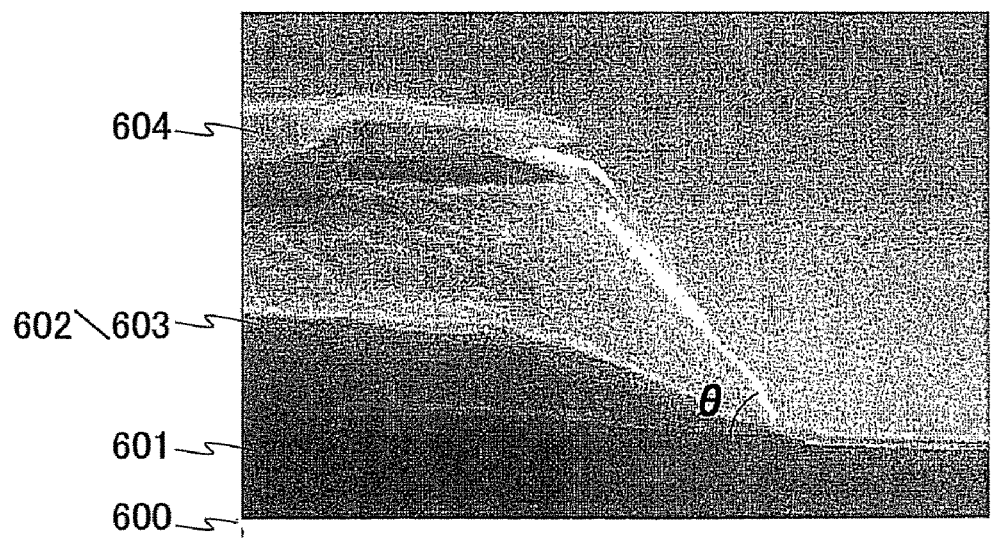
FIG. 9 is a SEM image of a cross section of Sample C after dry-etching.

FIG. 9 shows a SEM image at 10000-fold magnification of the cross section of Sample C after the dry-etching, taken by a scanning electron microscope. It is found from FIG. 9 that an insulating film 601 formed using polyimide is on a substrate 600, and a titanium film 602, an aluminum film 603, and a mask 604 are stacked in this order on the insulating film 601. In FIG. 9, it is found that the insulating film 601 is partly exposed by removing parts of the aluminum film 603 and the titanium film 602. In FIG. 9, furthermore, it is found that at the edge portion of the conductive film including the titanium film 602 and the aluminum film 603 in Sample C, the taper angle θ formed between the surface of the conductive film and the top surface of the insulating film 601 is about 55°.

As for Sample C, the thickness of the aluminum film 603 is about 4 µm that is smaller by about 1 µm than that of the aluminum film 403 of Sample A whereas the thickness of the mask 604 shown in FIG. 9 is about 0.63 µm, which is as large as that of the mask 404 (about 0.7 µm) shown in FIG. 4B. Further, since the thickness of the mask 604 shown in FIG. 9 is as small as about 0.63 µm, it is considered that all of the mask 404 will disappear when patterning of Sample A is performed only by dry-etching. Further, even with a mask having the thickness increased to 2.5 to 3 µm, it is estimated that the thickness of the aluminum film, thickness of the aluminum film in the case where patterning of the conductive film can be completed before disappearance of the mask in the dry-etching process is estimated to be about 5 µm at a maximum. Further, considering variation of the mask thickness within the substrate surface, it is estimated thickness of the aluminum film in the case where patterning of the conductive film can be completed before disappearance of the mask in the dry-etching process is estimated to be about 3 µm at a maximum.

From the comparison of the FIG. 4B and FIG. 9, it is found that the reduction in thickness of the mask can be suppressed by etching the conductive film to be a predetermined thickness by wet-etching and then etching the rest by dry-etching as described in Embodiment 1, compared to the case of etching only by dry-etching. Accordingly, it is found that according to the method for etching a conductive film described in Embodiment 1, the conductive film can be etched so that the conductive film has a predetermined thickness and less shape difference from a mask pattern, compared to the case of etching only by dry-etching.

Embodiment 3

In this embodiment, a method for manufacturing a semiconductor device will be described using an RF tag as one semiconductor device, as an example. This embodiment will describe the case where the method for etching a conductive film described in Embodiment 1 is applied to the manufacturing of an antenna provided for an RF tag; however, the method for etching a conductive film described in Embodiment 1 can be applied not only to the manufacturing of the antenna but also to the manufacturing of a wiring, an electrode, or other conductive films having predetermined shapes. Further, although a thin film transistor (TFT) will be used as an example of a semiconductor element in this embodiment, a semiconductor element used for a semiconductor device of the present invention is not limited thereto. For example, as well as a TFT, a memory element, a diode, a resistor, a coil, a capacitor, an inductor, or the like can be used.

First, as shown in FIG. 10A, an insulating film 701 and a semiconductor film 702 are formed in this order on a substrate 700 having a heat-resisting property. The insulating film 701 and the semiconductor film 702 can be formed consecutively As the substrate 700, a glass substrate made of barium borosilicate glass, aluminoborosilicate glass, or the like; a quartz substrate; a ceramic substrate; or the like can be used. Alternatively, a metal substrate such as a stainless-steel substrate having an insulating film on its surface or a silicon substrate having an insulating film on its surface may be used. Further alternatively, a flexible substrate, which is made of a synthetic resin such as plastic or the like and whose heat-proof temperature is generally lower than that of the above substrates, can be used as long as the substrate can resist the processing temperature in the manufacturing process.

As examples of the plastic substrate, the following can be used: polyester typified by polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

With the insulating film 701, alkaline earth metal or alkali metal such as Na contained in the substrate 700 is prevented from being diffused into the semiconductor film 704 and adversely affecting the characteristics of the semiconductor element such as a transistor. Therefore, the insulating film 701 is formed using silicon oxide, silicon oxynitride, silicon nitride, silicon nitride oxide, or the like which can suppress the diffusion of alkali metal and alkaline earth metal into the semiconductor film 702. In the case of using a substrate containing alkali metal or alkaline earth metal, such as a glass substrate, a stainless-steel substrate, or a plastic substrate, it is effective in preventing diffusion of impurities to provide the insulating film 701 between the substrate 700 and the semiconductor layer 702. However, the insulating film 701 is not necessarily provided if the diffusion of impurities does not lead to any significant problem, such as in the case of using a quartz substrate.

The insulating film 701 is formed by depositing an insulating material such as silicon oxide, silicon nitride (e.g., SiNx or $Si_3N_4$), silicon oxynitride, or silicon nitride oxide by a CVD method, a sputtering method, or the like. Note that silicon oxynitride contains more amount of oxygen than that of nitrogen and, in the case where the composition of silicon oxynitride is measured using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more amount of nitrogen than that of oxygen and, in the case where the composition of silicon nitride oxide is measured using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen which are included in silicon oxynitride or silicon nitride oxide fall within the ranges given above, where the total number of atoms contained in the silicon oxynitride or silicon nitride oxide film is defined as 100 at. %.

The insulating film 701 may be a single insulating film or a stack insulating film in which a plurality of insulating films is stacked. In this embodiment, the insulating film 701 is formed by stacking a 100-nm-thick silicon oxynitride film, a 50-nm-thick silicon nitride oxide film, and a 100-nm-thick silicon oxynitride film in this order. However, the material and the thickness of each film and the number of stacked films are not limited to these. For example, instead of the silicon oxynitride film as the base layer, a siloxane-based resin film with a thickness of 0.5 to 3 μm may be formed by a spin coating method, a slit coating method, a droplet discharge method, a printing method, or the like. In addition, the silicon nitride oxide film as the middle layer may be replaced with a silicon nitride (e.g., SiNx or $Si_3N_4$) film. Further, the silicon oxynitride film as the top layer may be replaced with a silicon oxide film. The thickness of each film is preferably 0.05 to 3 μm, and the thickness may be selected as appropriate from this range.

The silicon oxide film can be formed using a mixed gas of silane and oxygen, TEOS (tetraethoxysilane) and oxygen, or the like by a thermal CVD method, a plasma CVD method, an atmospheric pressure CVD method, a bias ECR-CVD method, or the like. The silicon nitride film can be formed typically using a mixed gas of silane and ammonia by a plasma CVD method. The silicon oxynitride film and the silicon nitride oxide film each can be formed typically using a mixed gas of silane and dinitrogen monoxide by a plasma CVD method.

The semiconductor film 702 is preferably formed without exposure to the air after the formation of the insulating film 701. The semiconductor film 702 is formed with a thickness of 20 to 200 nm (preferably 40 to 170 nm, more preferably 50 to 150 nm). The semiconductor film 702 can be formed using an amorphous semiconductor, a microcrystalline semiconductor, a polycrystalline semiconductor, or a single crystal semiconductor. As the semiconductor, silicon germanium as well as silicon can be used. In the case of using silicon germanium, the concentration of germanium is preferably in the range of about 0.01 to 4.5 at. %.

Note that the semiconductor film 702 may be crystallized by a known technique. As a known crystallization method, there are a laser crystallization method with laser light and a crystallization method with a catalytic element. Alternatively, a crystallization method with a catalytic element and a laser crystallization method can be used in combination. In the case of using a thermally stable substrate having a high heat-resisting property, made of quartz or the like as the substrate 700, it is possible to combine any of the following crystallization methods: a thermal crystallization method with an electrically heated oven, a lamp anneal crystallization method with infrared light, a crystallization method with a catalytic element, and high temperature annealing method at about 950° C.

For example, in the case of using laser crystallization method, heat treatment at 500° C. for 4 hours is performed on the semiconductor film 720 before the laser crystallization in order to improve resistance of the semiconductor film 702 to laser. Then, by irradiating the semiconductor film 702 with a laser beam having second to fourth harmonics of the fundamental wave, using a solid laser capable of continuous oscillation, a crystal with large grain size can be obtained. Typically, the second harmonic (532 nm) and/or the third harmonic (355 nm) of an Nd:$YVO_4$ laser (fundamental wave is 1064 nm) are/is preferably used. Specifically, the laser light emitted from the continuous wave $YVO_4$ laser is converted into the harmonic by a non-linear optical element to obtain laser light having the output of 10 W. Then, it is preferable to shape the laser light into a rectangular or elliptical shape on an irradiation surface by an optical system so that the surfaces of the semiconductor film 702 is irradiated with the laser light. The power density of the laser light at this time is set at about 0.01 to 100 MW/cm$^2$, preferably 0.1 to 10 MW/cm$^2$. The scanning rate is set at about 10 to 2000 cm/sec for the irradiation.

As a continuous-wave gas laser, an Ar laser, a Kr laser, or the like can be used. As a continuous-wave solid-state laser, the following can be used: a YAG laser, a YvO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like.

Alternatively, the following pulsed laser can be used: an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, or a gold vapor laser.

The laser crystallization may be performed by pulsed-oscillation laser light at a repetition rate of greater than or equal to 10 MHz, which is a considerably higher frequency band than a generally used frequency band of several tens to several hundreds of hertz. It is said that the time from when the semiconductor film 702 is irradiated with a pulsed laser beam to be melted through when the semiconductor film 702 is completely solidified is several tens to several hundreds of nanoseconds. Therefore, with the use of the above frequency band, the semiconductor film 702 can be irradiated with a pulsed laser beam before the semiconductor film 702 which has been melted by the preceding laser beam is completely solidified melted by the laser light. Accordingly, a solid-liquid interface can be continuously moved in the semiconductor film 702, so that the semiconductor film 702 having crystal grains that have grown continuously in the scanning direction of the laser light is formed. Specifically, an aggregation of crystal grains each having a width of 10 to 30 μm in the scanning direction and a width of about 1 to 5 μm in a direction perpendicular to the scanning direction of the laser light can be formed. By forming single crystal grains which have been grown continuously along the scanning direction, the semiconductor film 102 can be formed having almost no crystal boundary at least in the channel direction of the TFT.

The laser crystallization can be performed by synchronous irradiation with a fundamental wave of continuous-wave laser light and a harmonic of continuous-wave laser light, or by synchronous irradiation with a fundamental wave of continuous-wave laser light and a harmonic of pulsed laser light.

The laser irradiation can be performed in an inert gas atmosphere of a rare gas, nitrogen, or the like; accordingly, roughness of the semiconductor surface caused by the laser irradiation can be suppressed, and variations in the threshold voltage of a transistor caused by variations in the interface state density can also be suppressed.

By the above-described laser irradiation, the semiconductor film 702 can be formed having higher crystallinity. Note that a polycrystalline semiconductor which is formed by a sputtering method, a plasma CVD method, a thermal CVD method, or the like may be used as the semiconductor film 702.

Further, although the semiconductor film 702 is crystallized in this embodiment, the following process may be performed with an amorphous silicon film or microcrystalline silicon film without a crystallization process. A TFT formed using an amorphous semiconductor or a microcrystalline semiconductor involves less fabrication steps than TFTs formed using a polycrystalline semiconductor; therefore, it has an advantage of low cot and high yield.

The amorphous semiconductor can be obtained by glow discharge decomposition of a gas containing silicon. As examples of the gas containing silicon, SiH$_4$, Si$_2$H$_6$, and the like can be given. The gas containing silicon may be diluted with hydrogen or with hydrogen and helium.

Next, channel doping is performed on the semiconductor film 702, by which an impurity element which provides p-type conductivity or an impurity element which provides n-type conductivity is added at a low concentration. The channel doping is performed on the semiconductor film 702 either entirely or partly. As the impurity element which provides p-type conductivity, boron (B), aluminum (Al), gallium (Ga), or the like can be used. As the impurity element which provides n-type conductivity, phosphorus (P), arsenic (As), or the like can be used. In this embodiment, boron (B) is used as the impurity element and added at a concentration of $1\times10^{16}$ to $5\times10^{17}$/cm$^3$.

Next, as shown in FIG. 10B, the semiconductor film 702 is processed (patterned) into a predetermined shape, so that island-shaped semiconductor films 703 and 704 are formed. Then, as shown in FIG. 10C, transistors 705 and 706 are formed using the semiconductor films 703 and 704.

Specifically, gate insulating films 707 are formed over the semiconductor films 703 and 704. Then, conductive films 708 and 709 which are processed (patterned) into predetermined shapes are formed over the gate insulating films 707. The conductive film 708 on the semiconductor film 703 functions as a gate electrode of the transistor 705. The conductive film 709 on the semiconductor film 704 functions as a gate electrode of the transistor 706.

Further, in the case shown in FIG. 10C, sidewalls 710 are formed on the sides of the conductive films 708 and 709 by using an insulating film. Then, using the conductive films 708 and 709 and the sidewalls 710, or a patterned resist as a mask, an impurity which provides n-type conductivity or an impurity which provides p-type conductivity is added into each of the semiconductor films 703 and 704 to form source regions, drain regions, and the like. In FIG. 10C, the transistor 705 is a p-channel transistor and the transistor 706 is an n-channel transistor.

As the gate insulating film 707, a single layer or a stack layer selected from a silicon oxide film, a silicon oxynitride film, a silicon nitride film, a silicon nitride oxide film, and the like is used. When the gate insulating film 707 is a stack layer, it is preferable to use a three-layer structure in which a silicon oxide film, a silicon nitride film, and a silicon oxide film are stacked in this order on the substrate 700. Further, as the forming method, a plasma CVD method, a sputtering method, or the like can be used. For example, in the case where a gate insulating film using silicon oxide is formed by a plasma CVD method, a gas in which TEOS (tetraethyl orthosilicate) and O$_2$ are mixed is used, the reaction pressure is set at 40 Pa, the substrate temperature is set at 300 to 400° C., and the high-frequency (13.56 MHz) power density is set at 0.5 to 0.8 W/cm$^2$.

Alternatively, the gate insulating films 707 may be formed by oxidizing or nitriding the surfaces of the semiconductor films 703 and 704 by high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In this case, with plasma excitation performed by introduction of microwaves, plasma with a low electron temperature and a high density can be generated. By oxidizing or nitriding the surfaces of the semiconductor films 703 and 704 by oxygen radicals (there is a case where an OH radical is included) or nitrogen radicals (there is a case where an NH radical is included) generated by such high density plasma, insulating films with a thickness of 1 to 20 nm, typically 5 to 10 nm are formed so as to be in contact with the semiconductor films 703 and 704. These insulating films with a thickness of 5 to 10 nm are used as the gate insulating films 707.

The Oxidation or nitridation of the semiconductor film by the above-described high-density plasma treatment is carried out by solid-phase reaction; therefore, interface state density between the gate insulating film and the semiconductor film can be suppressed to be quite low. Further, by directly oxidizing or nitriding the semiconductor film by high-density plasma treatment, variations in thickness of the insulating film to be formed can be suppressed. Furthermore, in the case where the semiconductor film has crystallinity and the surface of the semiconductor film is oxidized by solid-phase reaction using high-density plasma treatment, acceleration of the oxidation only at crystal grain boundaries can be suppressed, so that an uniform gate insulating film with a low interface state density can be formed. Variations in characteristics of the transistor whose gate insulating film includes an insulating film formed by the high-density plasma treatment can have suppressed.

Further alternatively, aluminum nitride can be used for the gate insulating films 707. Aluminum nitride, which has high thermal conductivity, can effectively diffuse heat generated in the transistor. Alternatively, silicon oxide, silicon oxynitride, or the like containing no aluminum may be formed and then aluminum nitride may be stacked thereon to form the gate insulating film.

The conductive films 708 and 709 can be formed using tantalum (Ta), tungsten (W), titanium (Ti), molybdenum (Mo), aluminum (Al), copper (Cu), chromium (Cr), niobium (Nb), or the like. Alternatively, an alloy containing the above-described metal as a main component or a compound containing the above-described metal may be used. Further alternatively, a semiconductor such as polycrystalline silicon, in which an impurity element such as phosphorus which provides conductivity is doped, can be used.

Although the conductive films 708 and 709 are single-layer conductive films in this embodiment, the present invention is not limited to this structure. The conductive films 708 and 709 each may have a structure in which two or more conductive films are stacked. In the case of using a three-layer structure in which three conductive films are stacked, it is preferable to use a stack structure of a molybdenum film, an aluminum film, and a molybdenum film.

Alternatively, the conductive films 708 and 709 each may have a two-layer structure in which the first-layer conductive film is made of tantalum nitride or tantalum (Ta) and the second-layer conductive film is made of tungsten (W). As the combinations of two conductive films, a tungsten nitride film and a tungsten film, a molybdenum nitride film and a molybdenum film, an aluminum film and a tantalum film, an aluminum film and a titanium film, and the like are given in addition to the example described above. Since tungsten and tantalum nitride have high heat resistance, heat treatment for the purpose of thermal activation can be performed in the process after the formation of the two-layer conductive films. Further alternatively, as the combination of the two-layer conductive film, for example, nickel silicide and silicon doped with an impurity which provides n-type conductivity, $WSi_x$ and silicon doped with an impurity which provides n-type conductivity, or the like may be used.

The conductive films 708 and 709 can be formed by a CVD method, a sputtering method, or the like.

As a mask used for forming the conductive films 708 and 709, silicon oxide, silicon oxynitride, or the like may be used as well as a resist. In this case, although a step for forming a mask of silicon oxide, silicon oxynitride, or the like with patterning is added, since there is less reduction in thickness of the above mask at the time of etching than the case of using a resist, the conductive films 708 and 709 can be formed having predetermined shapes. Alternatively, the conductive films 708 and 709 may be selectively formed by a droplet discharge method without using a mask. Note that the droplet discharge method means a method of forming a predetermined pattern by discharging or jetting a droplet containing a predetermined composition from an orifice; an ink-jet method is an example thereof.

As for the formation of the conductive films 708 and 709, the etching method and the kind of an etchant may be selected as appropriate in accordance with the material of the conductive films.

After the formation of the impurity regions, activation of the impurity regions with heat treatment may be performed. For example, a 50-nm-thick silicon oxynitride film may be formed, and then, heat treatment may be performed at 550° C. for 4 hours in a nitrogen atmosphere.

Further, a 100-nm-thick silicon nitride film containing hydrogen may be formed, and then, heat treatment may be performed at 410° C. for 1 hour in a nitrogen atmosphere, so that the semiconductor films 703 and 704 are hydrogenated. Alternatively, heat treatment may be performed at 400 to 700° C., preferably 500 to 600° C. in a nitrogen atmosphere in which the oxygen concentration is 1 ppm or less, preferably 0.1 ppm or less, and then, heat treatment may be performed at 300 to 450° C. for 1 to 12 hours in an atmosphere containing hydrogen at 3 to 100%, so that the semiconductor films 703 and 704 are hydrogenated. This step is performed for the purpose of termination of dangling bonds of the semiconductor films 703 and 704 with the use of thermally excited hydrogen. As another means for the hydrogenation, plasma hydrogenation (using hydrogen that is excited by plasma) may be performed. Further, the activation treatment may be performed after an insulating film 711 is later formed.

The heat treatment can be performed by a thermal annealing method using an annealing furnace, a laser annealing method, a rapid thermal annealing method (an RTA method), or the like. By the heat treatment, not only hydrogenation but also activation of the impurity elements that has been added into the semiconductor films 703 and 704 can be performed.

Through the above process, the p-channel transistor 705 and the n-channel transistor 706 can be formed. Note that the method for manufacturing each transistor is not limited to the above-described process.

Figure 11A:
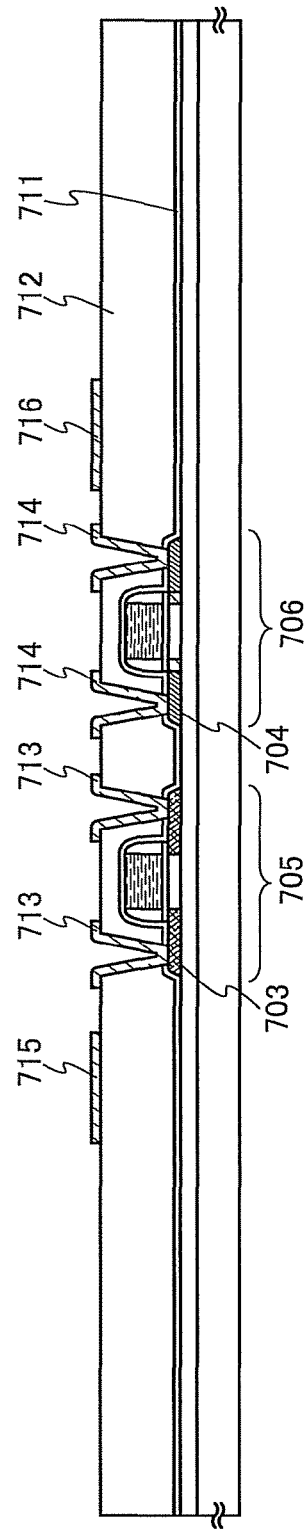
FIGS. 11A and 11B illustrate the manufacturing method of the semiconductor device, according to the embodiment of the present invention.

Next, as shown in FIG. 11A, the insulating film 711 is formed so as to cover the transistors 705 and 706. Although the insulating film 711 is not necessarily provided, the provision of the insulating film 711 makes it possible to prevent impurities such as alkali metal or alkaline earth metal from diffusing the transistors 705 and 706. Specifically, it is preferable that the insulating film 711 is formed using silicon nitride, silicon nitride oxide, aluminum nitride, aluminum oxide, silicon oxynitride, silicon oxide, or the like. In this embodiment, a silicon oxynitride film with a thickness of about 600 nm is used as the insulating film 711. In this case, the above-described hydrogenation treatment may be performed after the formation of the silicon oxynitride film.

Next, an insulating film 712 is formed over the insulating film 711 so as to cover the transistors 705 and 706. The insulating film 712 can be formed using an organic resin film, an inorganic insulating film, or a siloxane-based insulating film. In the case of the organic resin film, acrylic, epoxy, polyimide, polyamide, polyvinyl phenol, benzocyclobutene, or the like can be used. In the case of the inorganic insulating film, silicon oxide, silicon oxynitride, silicon nitride oxide, a material containing carbon typified by DLC (diamond like carbon), PSG (phosphorous silicate glass), BPSG (boron phosphorous silicate glass), or the like can be used. In the case of the siloxane-based insulating film, a siloxane-based resin having a skeleton structure formed of a silicon(Si)-oxygen (O) bond is used. As a substituent, at least one kind selected from fluorine, a fluoro group, and an organic group (e.g., an alkyl group or an aryl group) may be included in addition to hydrogen. The insulating film 712 may be formed by stacking a plurality of insulating films formed using any of the above materials.

For the formation of the insulating film 712, the following method can be used in accordance with the material of the insulating film 712: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like.

Although the insulating films 711 and 712 function as an interlayer insulating film in this embodiment, either a single-layer insulating film or a stack insulating film including three or more layers may be used as the interlayer insulating film.

Next, contact holes are formed in the insulating films 711 and 712 so as to expose a part of the semiconductor film 703 and a part of the semiconductor film 704. In the case where the semiconductor films 703 and 704 are covered with the gate insulating films 707, the contact holes are formed also in the gate insulating films 707 in addition to the insulating films 711 and 712. As an etching gas used for forming the contact holes, a mixed gas of $CHF_3$ and He is used in this embodiment; however, the etching gas is not limited thereto. Then, a conductive film 713 which is connected to the semiconductor film 703 through the contact hole, a conductive film 714 which is connected to the semiconductor film 704 through the contact hole, and conductive films 715 and 716 which are formed over the insulating film 712 are formed.

The conductive films 713 to 716 can be formed by a CVD method, a sputtering method, or the like. Specifically, the following can be used for the conductive films 713 to 716: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can be used. As each of the conductive films 713 to 716, a single film containing the above metal or a plurality of films stacked containing the above metal can be used.

As an example of an alloy containing aluminum as a main component, an alloy which contains aluminum as a main component and contains nickel can be given. In addition, an alloy which contains aluminum as a main component and contains nickel and one or both of carbon and silicon can be given. Aluminum and aluminum silicon, which have low resistance values and are inexpensive, are suitable materials for forming the conductive films 713 to 716. In particular, when aluminum silicon is used, generation of hillocks in resist baking can be suppressed more than the case of using an aluminum film, in patterning the conductive films 713 to 716; and instead of silicon (Si), Cu may be mixed into an aluminum film at about 0.5%.

As each of the conductive films 713 to 716, for example, a stack structure of a barrier-metal film, an aluminum silicon film, and a barrier-metal film may be used. The barrier-metal film can be formed using high-melting-point metal such as titanium (Ti), tantalum (Ta), tungsten (W), or molybdenum (Mo), a nitride of the high-melting-point metal, or the like. By forming the barrier films so as to be interposed between the aluminum film and the aluminum silicon film, generation of hillocks of aluminum or aluminum silicon can be further prevented. Further, by forming each barrier-metal film by using titanium, which is a highly-reducible element, even if a thin oxide film is formed on the semiconductor films 703 and 704, the oxide film is reduced by titanium contained in the barrier film, so that the conductive film 713 and the semiconductor film 703 can obtain good contact therebetween and the conductive film 714 and the semiconductor film 704 can obtain good contact therebetween. Further, a plurality of barrier-metal films may be stacked to be used. In this case, for example, each of the conductive films 713 to 716 can be formed to have a five-layer structure in which titanium, titanium nitride, aluminum silicon, titanium, and titanium nitride are deposited in this order.

In this embodiment, a titanium film, an aluminum film, and a titanium film are stacked in this order on the insulating film 712 and patterned to form the conductive films 713 to 716.

Figure 11B:
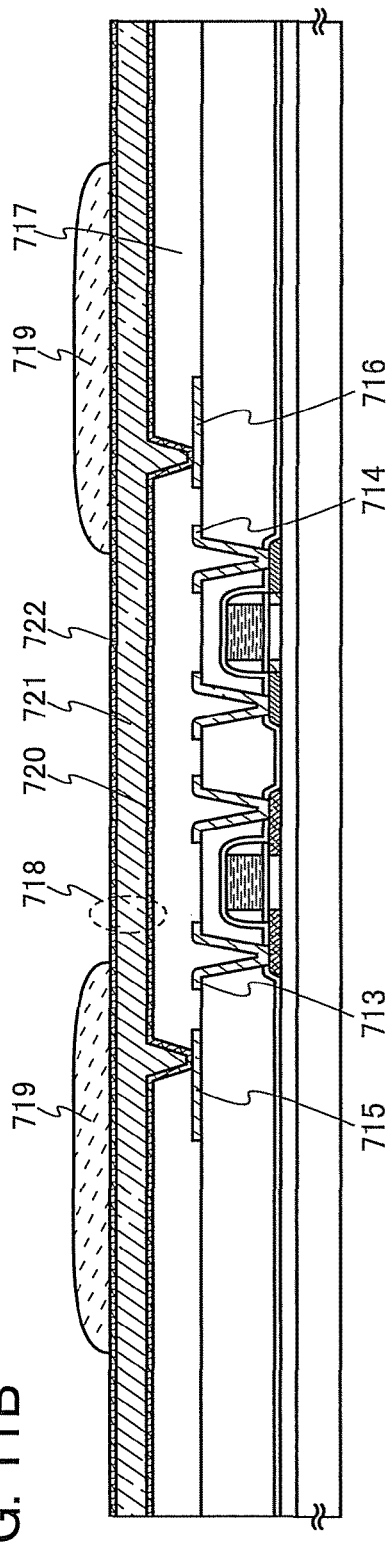

Next, as shown in FIG. 11B, an insulating film 717 is formed so as to cover the conductive films 713 to 716, and contact holes are formed in the insulating film 717 so as to expose a part of the conductive film 715 and a part of the conductive film 716.

The insulating film 717 can be formed by using an organic resin film, an inorganic insulating film, or a siloxane-based insulating film. In the case of using the organic resin film, acrylic, epoxy, polyimide, polyamide, polyvinyl phenol, benzocyclobutene, or the like can be used. In the case of the inorganic insulating film, silicon oxide, silicon oxynitride, silicon nitride oxide, a material containing carbon typified by DLC (diamond like carbon), PSG (phosphorous silicate glass), BPSG (boron phosphorous silicate glass), alumina, or the like can be used. In the case of the siloxane-based insulating film, a siloxane-based resin having a skeleton structure formed of a silicon(Si)-oxygen(O) bond is used. As a substituent, at least one kind selected from fluorine, a fluoro group, and an organic group (e.g., an alkyl group or an aryl group) may be included in addition to hydrogen. The insulating film 717 may be formed by stacking a plurality of insulating films formed using any of the above materials.

For the formation of the insulating film 717, the following method can be used in accordance with the material of the insulating film 717: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like.

Next, a conductive film 718 which is connected to the conductive films 715 and 716 through the contact holes formed in the insulating film 717 is formed over the insulating film 717.

The conductive film 718 can be formed by a CVD method, a sputtering method, or the like as is in the case of forming the conductive films 713 to 716. As the conductive film 718, a conductive film containing aluminum or an aluminum alloy can be used. The conductive film containing aluminum includes in its category a conductive film using a compound containing aluminum in addition to a conductive film in which aluminum is mixed.

As an example of an alloy containing aluminum as a main component, an alloy which contains aluminum as a main component and contains nickel can be given. In addition, an alloy which contains aluminum as a main component and contains nickel and one or both of carbon and silicon can be given. Aluminum and aluminum silicon, which have low resistance values and are inexpensive, are suitable materials for forming the conductive film 718. In particular, when aluminum silicon is used, generation of hillocks in resist baking can be suppressed more than the case of using an aluminum film, in patterning the conductive film 718; and instead of silicon (Si), Cu may be mixed into an aluminum film at about 0.5%.

Further, the conductive film 718 may have a stack structure in which the above-described conductive film containing aluminum or an aluminum alloy and a barrier-metal film are stacked. The barrier-metal film can be formed using high-melting-point metal such as titanium (Ti), tantalum (Ta), tungsten (W), or molybdenum (Mo), a nitride of the high-melting-point metal, or the like. In this case, for example, the conductive film 718 may be formed by stacking a barrier-metal film and the conductive film containing aluminum or an aluminum alloy in this order, or may be formed by stacking a barrier-metal film, the conductive film containing aluminum or an aluminum alloy, and a barrier-metal film in this order.

By forming the barrier films so as to be interposed between the aluminum or the aluminum alloy, generation of hillocks of the aluminum or the aluminum alloy can be prevented. Further, by forming the barrier-metal film by using titanium, which is a highly-reducible element, even if a thin oxide film is formed on the conductive films 715 and 716, the oxide film is reduced by titanium contained in the barrier film, so that the conductive film 718 and the conductive film 715 can obtain good contact therebetween and the conductive film 718 and the conductive film 716 can obtain good contact therebetween. Further, a plurality of barrier-metal films may be stacked to be used. In this case, for example, the conductive film 718 can be formed having a five-layer structure in which titanium, titanium nitride, aluminum silicon, titanium, and titanium nitride are deposited in this manner.

The conductive film 718 is formed such that the conductive film containing aluminum or an aluminum alloy has a thickness that is equal to or greater than 1 μm and equal to or less than 10 μm, preferably equal to or greater than 2 μm and equal to or less than 6 μm regardless of whether the conductive film 718 has a single-layer structure of the conductive film containing aluminum or an aluminum alloy, or a stack structure of a barrier-metal film and the conductive film containing aluminum or an aluminum alloy. Further, the barrier-metal film over or below the conductive film containing aluminum or an aluminum alloy is formed having a thickness that is equal to or greater than 50 nm and equal to or less than 300 nm.

In this embodiment, a barrier-metal film 720 formed using titanium with a thickness of about 100 nm, a conductive film 721 formed using aluminum with a thickness of about 5 nm, and a barrier-metal film 722 formed using titanium with a thickness of about 100 nm are stacked in this order on the insulating film 717 to form the conductive film 718.

Figure 12A:
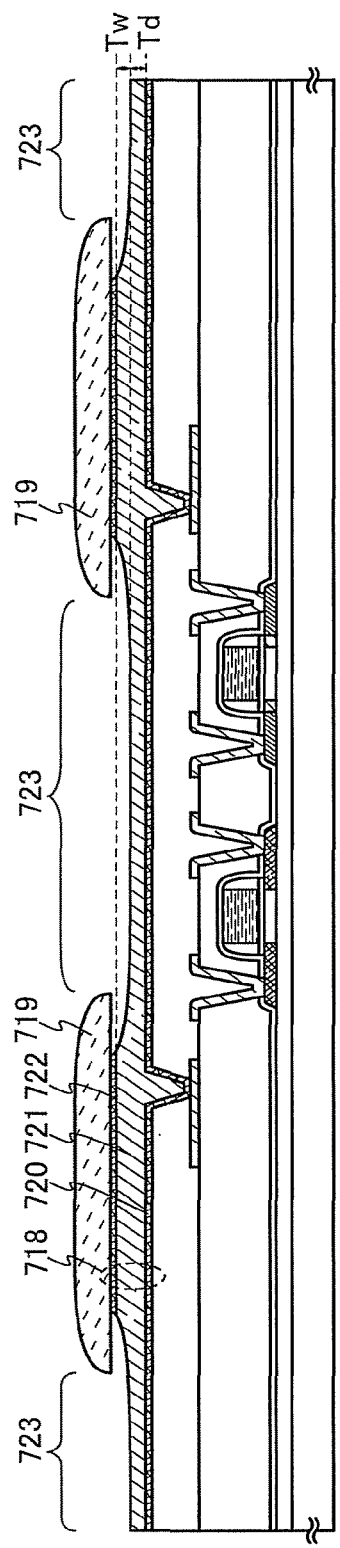
FIGS. 12A and 12B illustrate the manufacturing method of the semiconductor device, according to the embodiment of the present invention.

Next, a mask 719 is formed using a resist over the conductive film 718. Then, as shown in FIG. 12A, the conductive film 718 is etched by wet-etching to have a predetermined thickness. In this embodiment, since the conductive film 718 includes the barrier-metal film 720, the conductive film 721, and the barrier-metal film 722 stacked in this order, the barrier-metal film 722 as the top layer is etched first, and then the conductive film 721 as the middle layer is etched to have a predetermined thickness. By the wet-etching, a depressed portion which is opened toward the mask is formed in the conductive film 718 directly below an opening 723 of the mask 719.

For the wet-etching, the following known method can be used: a dipping method in which the object to be processed is dipped into a container filled with an etchant; a spray method in which an etchant is sprayed on the object to be processed; a spinning method in which an etchant is dropped on the object to be processed, attached on a turntable called a spinner; or the like. As the etchant, a solution containing nitric acid and ammonium fluoride, or the like can be used.

Specifically, in this embodiment, the wet-etching was performed by a spraying method in which an aqueous solution containing ammonium fluoride at less than 1% and nitric acid at less than 5%, which is obtained by diluting KSMF-230/5 (trade name) manufactured by KANTO CHEMICAL CO., INC with water, is sprayed as an etchant on the substrate 700 provided with the conductive film 718 at a pressure of 0.1 MPa and a solution temperature of 45° C.

The thickness Tw of the conductive film 721 which is etched off by the wet-etching is determined by the thickness Td of the conductive film 721 which is etched off by dry-etching next performed. The thickness Td of the conductive film 721 which is etched off by the dry-etching is set to be equal to or greater than 0.5 μm and equal to or less than 90 percent of the thickness of the conductive film 721 before the etching process. However, in the case where the thickness of the conductive film 721 before the etching process is too thick, etching-off of all of the conductive film 721 with a thickness of 90 percent of that before the etching process and the barrier-metal film 720 which is under the conductive film 721 might cause disappearance of the mask 719 in the dry-etching. Therefore, in the case where the thickness of the conductive film 721 before the etching process is thick, the maximum value of the thickness Td is set such that the mask 719 with maximum thickness assuring a predetermined resolution remains at least partly, considering the thickness of the barrier-metal film 720. Specifically, in this embodiment, the thickness of the mask 719 is set at 2.5 μm, the total thickness of the conductive film 721 is about 5 μm, the thickness Tw which is etched off by the wet-etching is set at about 2.5 μm, and the thickness Td which is etched off by the dry-etching is set at about 2.5 μm.

With the above wet-etching, in addition to the etching-off of the part of the conductive film 718 directly below the opening 723, the part of the conductive film 718 directly below the mask 719 is side-etched. However, in this embodiment, the thickness Tw which is etched off by the wet-etching is set at the above-described value, so that the side-etching can be suppressed compared to the case only by wet-etching.

Figure 12B:
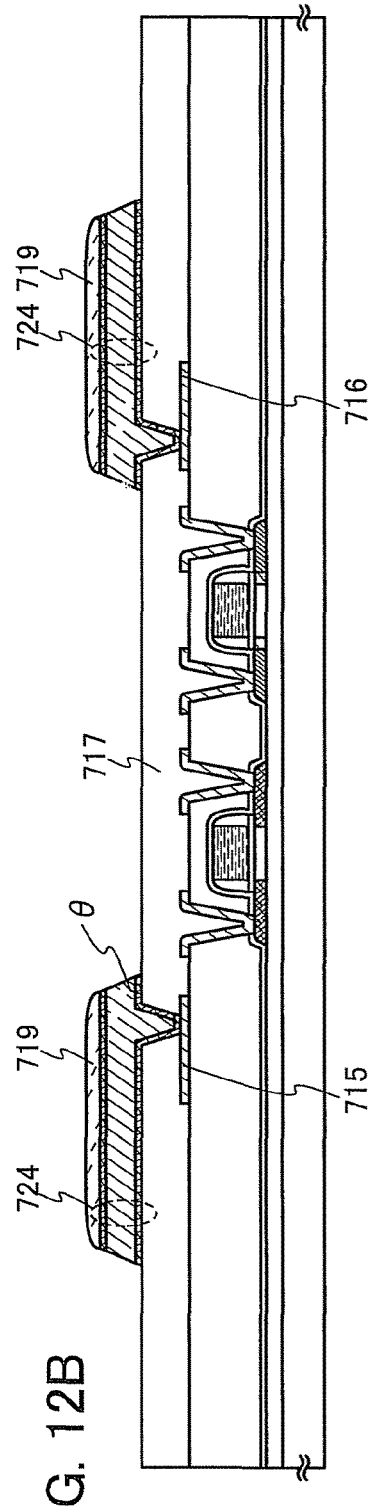

Next, as shown in FIG. 12B, the conductive film 718 after the wet-etching is etched by dry-etching, thereby forming a conductive film 724 having a predetermined shape. Since reduction in thickness of the mask 719 is caused by the dry-etching, so that the mask 719 after the dry-etching becomes smaller in the perpendicular and horizontal directions with respect to the top surface of the substrate 700.

In this embodiment, the following dry-etching method can be used: a reactive ion etching (RIE) method; an ICP (inductively coupled plasma) etching method; an ECR (electron cyclotron resonance) etching method; a parallel plate (capacitive coupled plasma) etching method; a magnetron plasma etching method; a dual-frequency plasma etching method; a helicon wave plasma etching method; or the like.

For example, in the case of using the ICP etching method, the flow rate of chlorine and the flow rate of boron trichloride, both the gases are included in an etching gas, may be 1 to 837 sccm and 1 to 1720 sccm, the RF (13.56 MHz) power which is supplied to a coil-electrode may be 0 W, the power which is supplied to a lower electrode (on the bias side) may be 50 to 5000 W, and the reaction pressure may be 0.5 to 133.3 Pa. Specifically, in this embodiment, the dry-etching is performed changing the setting condition of the dry-etching on the way of the process, as follows. First, the condition is set so that the flow rate of chlorine and the flow rate of boron trichloride, both the gases are included in the etching gas, are 250 sccm and 650 sccm, the reaction pressure is 2.0 Pa, the temperature of the lower electrode is 20° C., the RF (13.56 MHz) power which is supplied to the coil-electrode is 0 W, and the power which is supplied to the lower electrode (on the bias side) is 1500 W. Second, the condition is set so that the flow rate of chlorine and the flow rate of boron trichloride, both the gases are included in the etching gas, are 100 sccm and 700 sccm, the reaction pressure is 2.0 Pa, the temperature of the lower electrode is 21° C., the RF (13.56 MHz) power which is supplied to the coil-electrode is 0 W, and the power which is supplied to the lower electrode (on the bias side) is 750 W.

As the etching gas, a chloride gas such as chlorine, boron chloride, silicon chloride, or boron trichloride, or carbon tetrachloride; a fluoride gas such as carbon tetrafluoride, sulfur fluoride, or nitrogen fluoride; oxygen; or the like is used as appropriate.

With the dry-etching performed, the conductive film 724 having a stack structure can be formed such that the gradient of the edge portion can be steep, specifically such that a taper angle θ formed between the surface of the conductive film 724 at the edge portion and the top surface of the insulating film 717 which is a base film can be equal to or greater than 50° and equal to or less than 90°, preferably equal to or greater than 60° and equal to or less than 90°. Further, as compared to the case where only wet-etching is performed, the side-etching can be suppressed, whereby the conductive film 724 having a stack structure can be formed having high definition with less shape difference from the pattern of the mask 719 before the etching process. Further, the disappearance of the mask 719 due to the dry-etching can be prevented, so that the conductive film 724 after the etching process can have a predetermined thickness.

After the dry-etching, the remaining mask 719 is removed.

Through the above process, an RF tag as one of semiconductor devices can be manufactured.

A semiconductor element manufactured using the above-described method may be transferred onto a flexible substrate made of plastic or the like to form a semiconductor device. As the transferring method, the following various methods can be used: a method in which a metal oxide film is provided between the substrate and the semiconductor element, and the metal oxide film is made fragile by crystallization so that the semiconductor element is separated off and transferred; a method in which an amorphous silicon film containing hydrogen is provided between the substrate and the semiconductor element, and the amorphous silicon film is removed by laser-light irradiation or etching so that the semiconductor element is separated off from the substrate and transferred; a method in which the substrate, for which the semiconductor element is provided, is removed by mechanical cutting or etching by a solution or a gas so that the semiconductor element is cut off from the substrate, and the semiconductor element is transferred; and the like. The semiconductor element can be transferred regardless of before or after the conductive film 724 which functions as an antenna is manufactured.

In the case of the semiconductor device using the method for etching a conductive film described in Embodiment 1, the semiconductor element may be formed using a single crystal semiconductor by using an SOI (silicon on insulator) substrate. The SOI substrate can be manufactured using the following method: a wafer bonding method such as UNIBOND (registered trademark) typified by Smart-Cut (registered trademark), ELTRAN (epitaxial layer transfer), a dielectric separation method, or a PACE (plasma assisted chemical etching) method; a SIMOX (separation by implanted oxygen) method; or the like.

This embodiment can be combined with any of the above embodiments as appropriate to be implemented.

Embodiment 4

In this embodiment, change of the shape of the conductive film after dry-etching will be described when the thickness of the conductive film after the wet-etching was varied.

First, the method for manufacturing samples before an etching process will be described. Used in this embodiment was sample which was formed as follows: a 1.5-μm insulating film was formed using polyimide over a glass substrate, and a 100-nm titanium film, a 5-μm aluminum film, and a 100-nm titanium film were stacked in this order by a sputtering method, so that a conductive film having a three-layer structure was formed.

Then, a mask with a thickness of about 2.5 μm having a predetermined pattern was formed using a resist over the conductive film having the stack structure. A positive photoresist (TFR-1000H, manufactured by TOKYO OHKA KOGYO CO., LTD) was used as the resist.

The wet-etching was performed by a spraying method in which an aqueous solution containing ammonium fluoride at less than 1% and nitric acid at less than 5%, which was obtained by diluting KSMF-230/5 (trade name) manufactured by KANTO CHEMICAL CO., INC with water was sprayed as an etchant on Sample at a pressure of 0.1 MPa and a solution temperature of 45° C.

The dry-etching was performed changing the setting condition of the dry-etching, as follows. First, the condition is set so that the flow rate of chlorine and the flow rate of boron trichloride, both the gases are included in the etching gas, are 250 sccm and 650 sccm, the reaction pressure is 2.0 Pa, the temperature of the lower electrode is 20° C., the RF (13.56 MHz) power which is supplied to a coil-electrode is 0 W, and the power which is supplied to the lower electrode (on the bias side) is 1500 W. Second, the condition is set so that the flow rate of chlorine and the flow rate of boron trichloride, both the gases are included in the etching gas, are 100 sccm and 700 sccm, the reaction pressure is 2.0 Pa, the temperature of the lower electrode is 21° C., the RF (13.56 MHz) power which is supplied to the coil-electrode is 0 W, and the power which is supplied to the lower electrode (on the bias side) is 750 W.

Figure 18A:
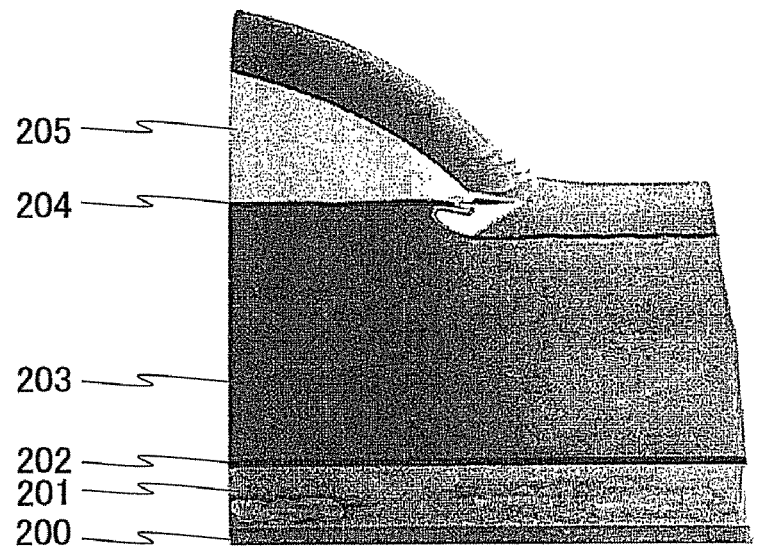
FIGS. 18A and 18B are a SEM image in a cross section of Sample after wet-etching and a SEM image in the cross section of Sample after dry-etching.

FIG. 18A shows a SEM image at 10000-fold magnification of the cross section of a sample after the wet-etching, taken by a scanning electron microscope. It is found from FIG. 18A that an insulating film 201 formed using polyimide is on a substrate 200, and a titanium film 202, an aluminum film 203, a titanium film 204, and a mask 205 are stacked in this order on the insulating film 201. In the sample after the wet-etching, it is found that the parts of the aluminum film 203 and the titanium film 204, directly below an opening of the mask 205, have been etched off by a depth of about 563 nm. Therefore, since the 100-nm titanium film 204 was used in the sample, the aluminum film 203 has been etched off by a depth of about 463 nm; thus, the thickness of the part of the aluminum film 203 after the wet-etching, directly below the opening of the mask 205 was 4537 nm.

Figure 18B:
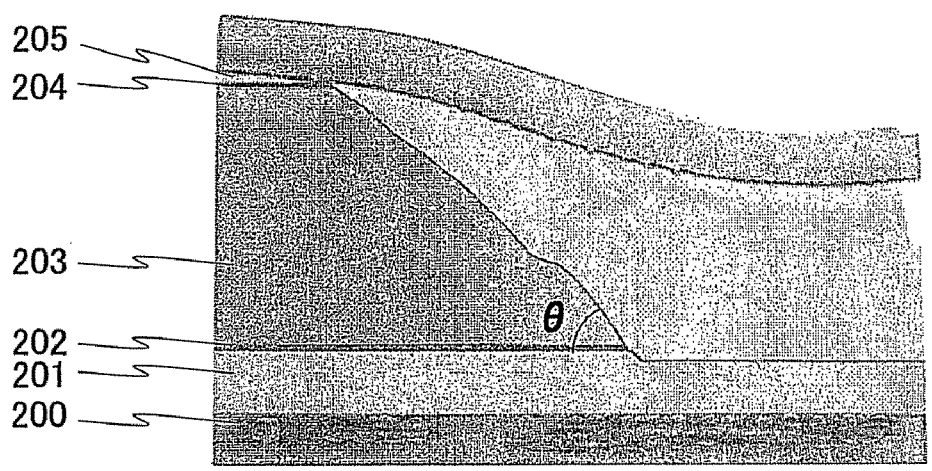

FIG. 18B shows a SEM image at 10000-fold magnification of the cross section of a sample after the dry-etching performed on the state of FIG. 18A, taken by a scanning electron microscope. As is shown in FIG. 18B, in the sample after the dry-etching, it is found that the parts of the titanium film 202, the aluminum film 203, and the titanium film 204, directly below the opening of the mask 205 have been removed to expose part of the insulating film 201. In addition, it is found that at the edge portion of the conductive film including the titanium film 202, the aluminum film 203, and the titanium film 204, the taper angle θ is about 52°. In addition, it is found that the conductive film after the dry-etching has been side-etched off by about 5.5 μm from the edge portion of the opening of the mask 205 before the wet-etching.

Figure 19A:
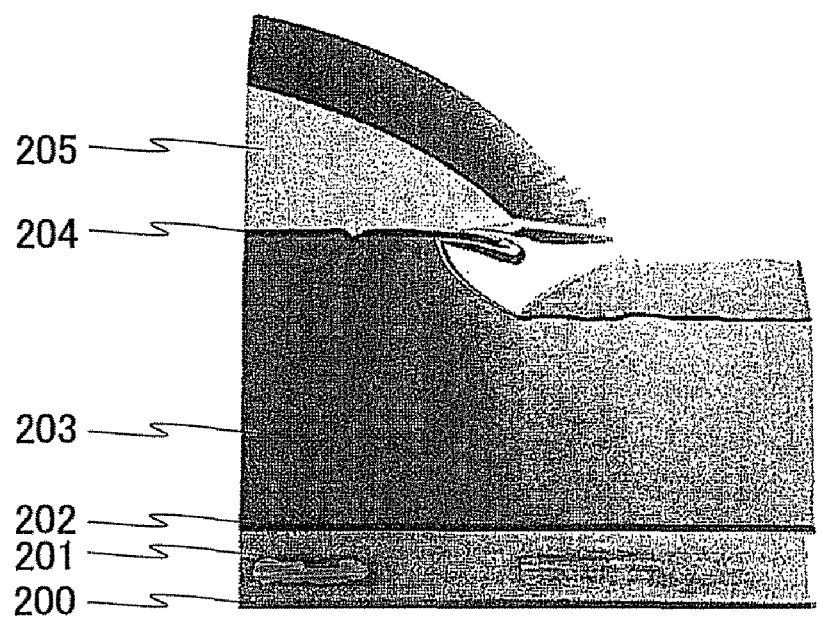
FIGS. 19A and 19B are a SEM image in a cross section of Sample after wet-etching and a SEM image in the cross section of Sample after dry-etching.

FIG. 19A shows a SEM image at 10000-fold magnification of the cross section of a sample after the wet-etching with more amount of wet-etching than in FIG. 18A. In the sample after the wet-etching shown FIG. 19A, it is found that the parts of the aluminum film 203 and the titanium film 204, directly below the opening of the mask 205 have been etched off by a depth of about 1388 nm. Therefore, since the 100-nm titanium film 204 was used in Sample, the aluminum film 203 has been etched off by a depth of about 1288 nm; thus, the thickness of the part of the aluminum film 203 after the wet-etching, directly below the opening of the mask 205 was 3712 nm.

Figure 19B:
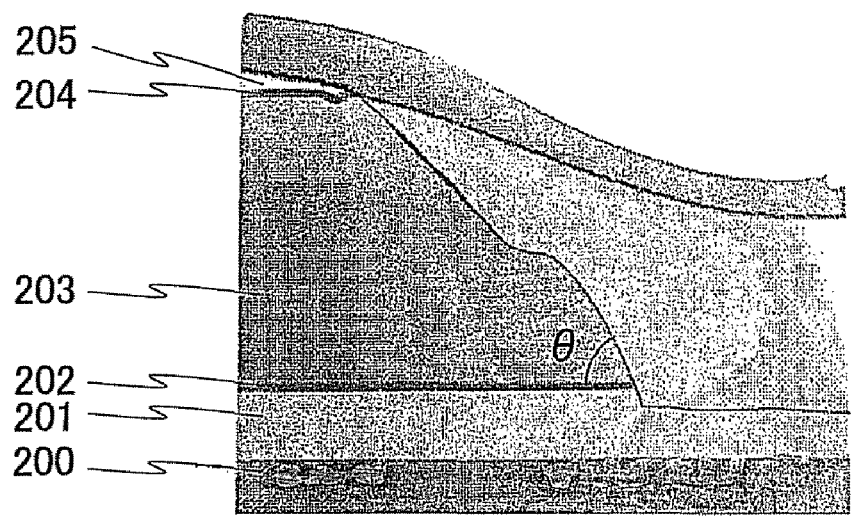

FIG. 19B shows a SEM image at 10000-fold magnification of the cross section of a sample after the dry-etching performed on the state of FIG. 19A. As is shown in FIG. 19B, in the sample after the dry-etching, it is found that the parts of the titanium film 202, the aluminum film 203, and the titanium film 204, directly below the opening of the mask 205 have been removed to expose part of the insulating film 201. In addition, it is found that at the edge portion of the conductive film including the titanium film 202, the aluminum film 203, and the titanium film 204, the taper angle θ is about 60°. In addition, the conductive film after the dry-etching has been side-etched off by about 4.5 μm from the edge portion of the opening of the mask 205 before the wet-etching.

Figure 20A:
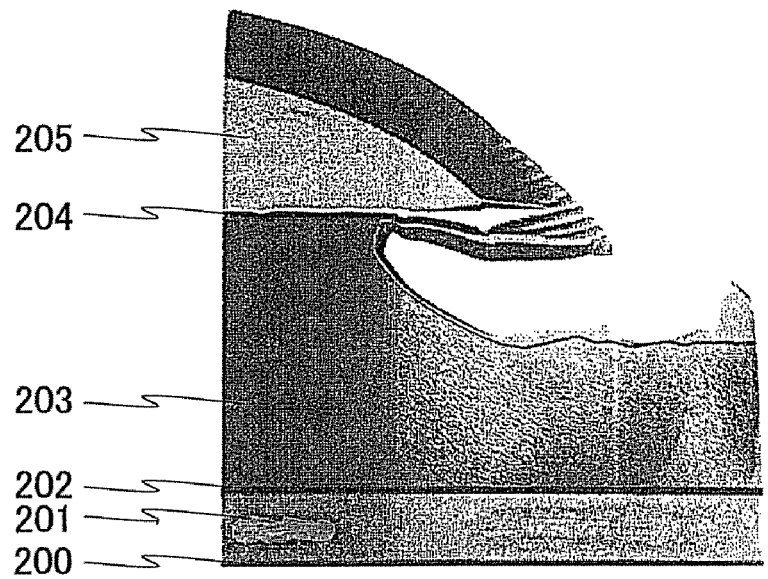
FIGS. 20A and 20B are a SEM image in a cross section of Sample after wet-etching and a SEM image in the cross section of Sample after dry-etching.

FIG. 20A shows a SEM image at 10000-fold magnification of the cross section of a sample after the wet-etching with more amount of wet-etching than in FIG. 19A. In the sample after the wet-etching shown FIG. 20A, it is found that the parts of the aluminum film 203 and the titanium film 204, directly below the opening of the mask 205 have been etched off by a depth of about 2155 nm. Therefore, since the 100-nm titanium film 204 was used in the sample, the aluminum film 203 has been etched off by a depth of about 2055 nm; thus, the thickness of the part of the aluminum film 203 after the wet-etching, directly below the opening of the mask 205 is 2945 nm.

Figure 20B:
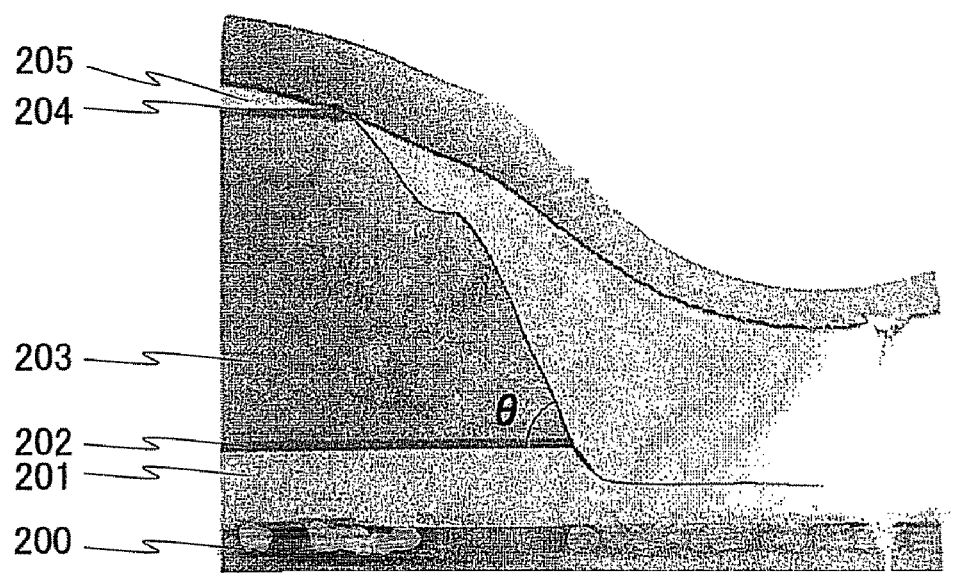

FIG. 20B shows a SEM image at 10000-fold magnification of the cross section of a sample after the dry-etching performed on the state of FIG. 20A. As is shown in FIG. 20B, in the sample after the dry-etching, it is found that the parts of the titanium film 202, the aluminum film 203, and the titanium film 204, directly below the opening of the mask 205 have been removed to expose part of the insulating film 201. In addition, it is found that at the edge portion of the conductive film including the titanium film 202, the aluminum film 203, and the titanium film 204, the taper angle θ is about 64°. In addition, it is found that the conductive film after the dry-etching has been side-etched off by about 3.8 μm from the edge portion of the opening of the mask 205 before the wet-etching.

Figure 21A:
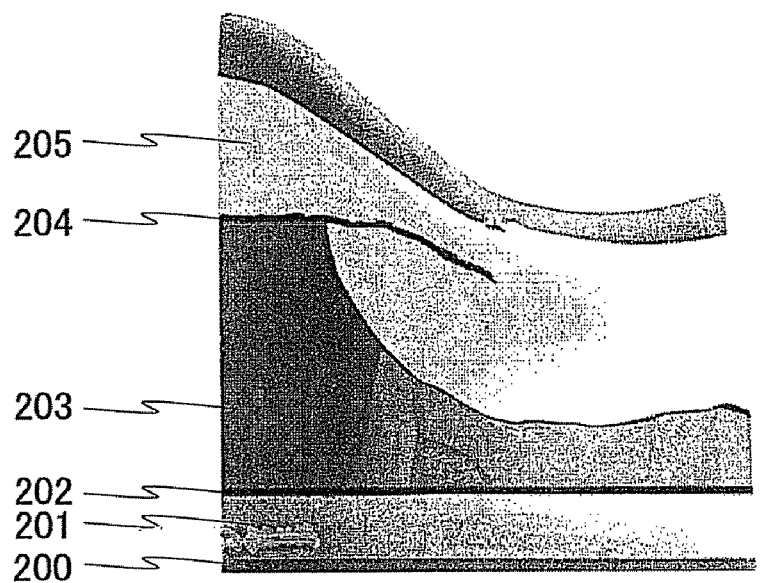
FIGS. 21A and 21B are a SEM image in a cross section of Sample after wet-etching and a SEM image in the cross section of Sample after dry-etching.

FIG. 21A shows a SEM image at 10000-fold magnification of the cross section of a sample after the wet-etching with more amount of wet-etching than in FIG. 20A. In the sample after the wet-etching shown FIG. 21A, it is found that the parts of the aluminum film 203 and the titanium film 204, directly below the opening of the mask 205 have been etched off by a depth of about 3417 nm. Therefore, since the 100-nm titanium film 204 was used in the sample, the aluminum film 203 has been etched off by a depth of about 3317 nm; thus, the thickness of the part of the aluminum film 203 after the wet-etching, directly below the opening of the mask 205 was 1683 nm.

Figure 21B:
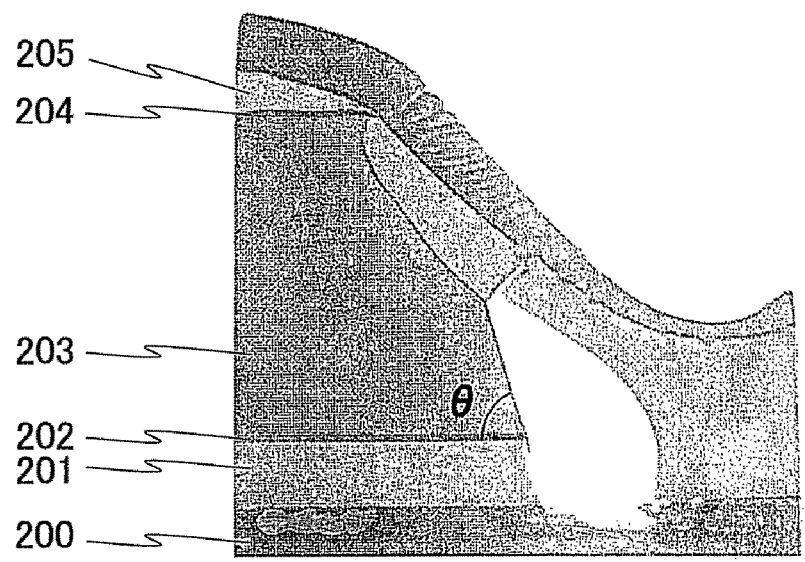

FIG. 21B shows a SEM image at 10000-fold magnification of the cross section of a sample after the dry-etching performed on the state of FIG. 21A. As is shown in FIG. 21B, in the sample after the dry-etching, the parts of the titanium film 202, it is found that the aluminum film 203, and the titanium film 204, directly below the opening of the mask 205 have been removed and the insulating film 201 has partly disappeared. In addition, it is found that at the edge portion of the conductive film including the titanium film 202, the aluminum film 203, and the titanium film 204, the taper angle θ is about 73°. In addition, it is found that the conductive film after the dry-etching has been side-etched off by about 2.7 μm from the edge portion of the opening of the mask 205 before the wet-etching.

Figure 22A:
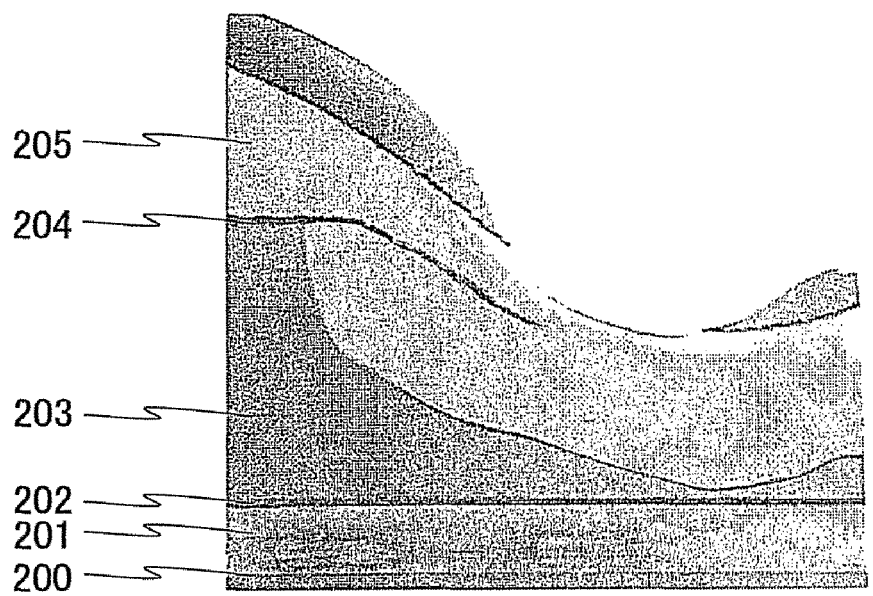
Figure 22A:
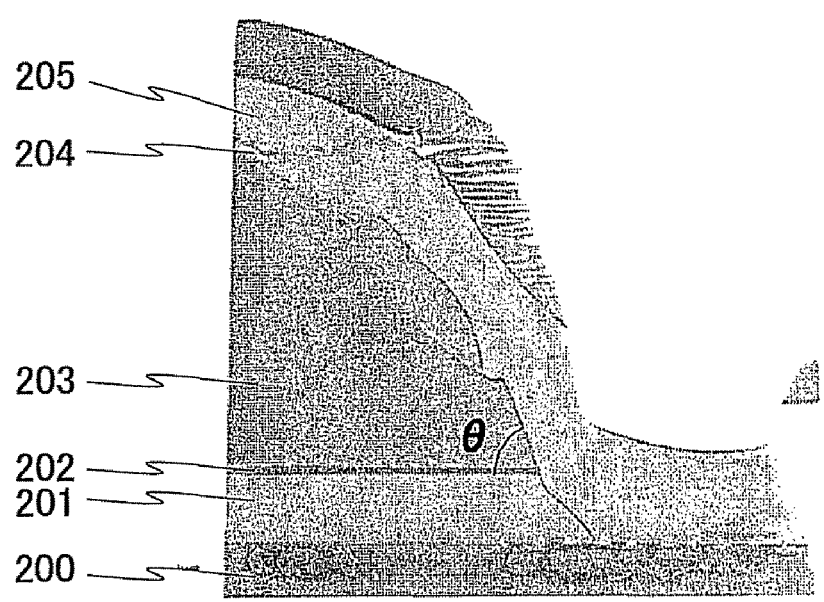

FIG. 22A shows a SEM image at 10000-fold magnification of the cross section of a sample after the wet-etching with more amount of wet-etching than in FIG. 21A. In the sample after the wet-etching shown FIG. 22A, it is found that the parts of the aluminum film 203 and the titanium film 204, directly below the opening of the mask 205 have been etched off by a depth of about 4524 nm. Therefore, since the 100-nm titanium film 204 was used in the sample, the aluminum film 203 has been etched off by a depth of about 4424 nm; thus, the thickness of the part of the aluminum film 203 after the wet-etching, directly below the opening of the mask 205 was 576 nm.

FIG. 22B shows a SEM image at 10000-fold magnification of the cross section of a sample after the dry-etching performed on the state of FIG. 22A. As is shown in FIG. 22B, in the sample after the dry-etching, it is found that the parts of the titanium film 202, the aluminum film 203, and the titanium film 204, directly below the opening of the mask 205 have been removed and the insulating film 201 has partly disappeared. In addition, it is found that at the edge portion of the conductive film including the titanium film 202, the aluminum film 203, and the titanium film 204, the taper angle θ is about 68°. In addition, it is found that the conductive film after the dry-etching has been side-etched off by about 3.3 μm from the edge portion of the opening of the mask 205 before the wet-etching.

From the SEM images of FIGS. 18A, 18B, 19A, 19B, 20A, 20B, 21A, 21B, 22A, and 22B, it is found that the thickness of the aluminum film 203 after wet-etching is set in the range of 0.5 μm to an either smaller value of 5 μm and 90 percent of the thickness before the wet-etching so that the taper angle θ of the conductive film after dry-etching next performed can be in an appropriate range of 50° to 90°.

As for the SEM images of FIGS. 21B and 22B, it is found that the insulating film 201 has partly disappeared by the dry-etching. As is shown in FIGS. 21A and 22A, the amount of etching by the wet-etching previously performed has been large in the samples shown in FIGS. 21B and 22B. Therefore, it is predicted that variation of the amount of etching by the wet-etching within the substrate surface will become large to cause part disappearance of the insulating film 201 through the dry-etching. In order to suppress the variation of the amount of etching by wet-etching within the substrate surface and to suppress the disappearance of the insulating film 201, it is preferable that the thickness of the aluminum film 203 after the wet-etching is set at 40 percent or more of the thickness of the aluminum film 203 before the etching process, in addition to satisfying the above-described condition for providing an appropriate taper angle.

Further, as for the side-etching, the side-etching has been small as much as 4 μm or less in Samples in FIGS. 20B, 21B, and 22B. Therefore, in order to suppress the side-etching to 4 μm or less, it is preferable that the thickness of the aluminum film 203 after the wet-etching is set at 60 percent or less of the thickness of the aluminum film 203 before the etching process, in addition to satisfying the above-described condition for providing an appropriate taper angle.

This embodiment can be combined with any of the above embodiments as appropriate to be implemented.

Example 1

Next, the structure of an RF tag as one semiconductor device will be described.

Figure 13A:
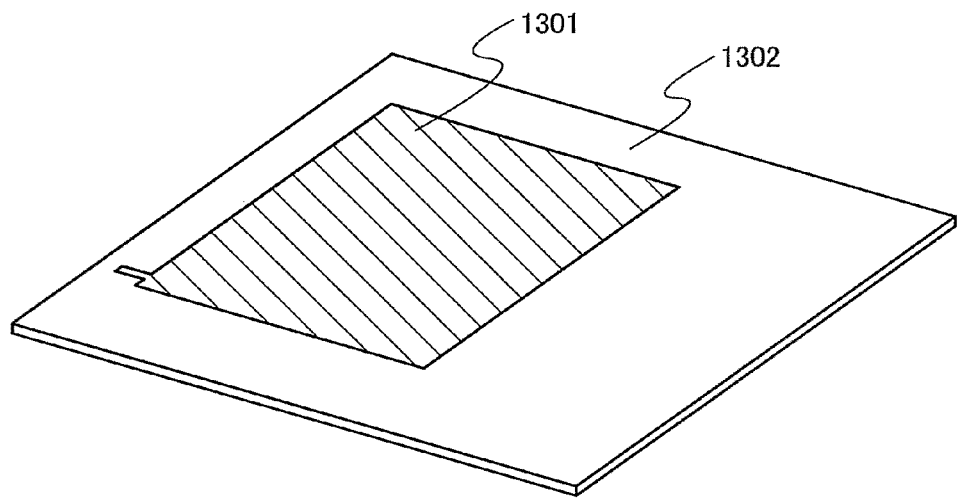
FIGS. 13A and 13B are perspective views each of an RF tag.
Figure 13B:
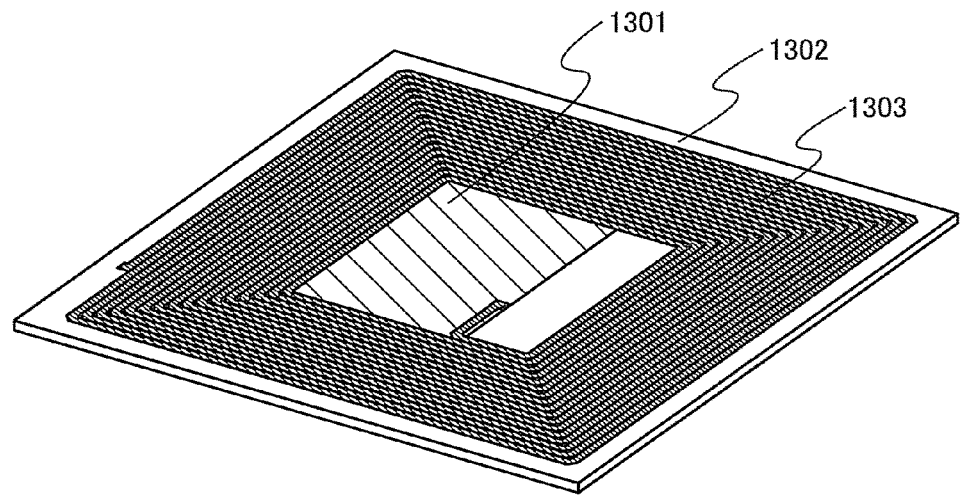

First, FIG. 13A illustrates the appearance where an integrated circuit 1301 included in an RF tag is formed over a substrate 1302. FIG. 13B illustrates the appearance where an antenna 1303 formed using the method for etching a conductive film described in Embodiment 1, over the substrate 1302, and the integrated circuit 1301 shown in FIG. 13A is electrically connected to the integrated circuit 1301.

Although FIG. 13B illustrates an on-chip RF tag in which the integrated circuit 1301 and the antenna 1303 are formed over the same substrate 1302, the present invention is not limited this structure. An antenna may be formed using the method for etching a conductive film described in Embodiment 1, over another substrate, and electrically connected to the integrated circuit 1301. Alternatively, the method for etching a conductive film described in Embodiment 1 can be applied to an RF tag in which a booster antenna capable of converting radio wave frequency without contact is provided between an interrogator and the antenna 1303 electrically connected to the integrated circuit 1301.

Further, although FIG. 13B illustrates the case where the antenna 1303 is coiled, the shape of an antenna which can be formed by the method for etching a conductive film described in Embodiment 1 is not limited to this shape. The shape of the antenna 1303 is not limited as long as the antenna can receive signals wirelessly. For example, a dipole antenna, a patch antenna, a loop antenna, a Yagi antenna, or the like can be used. The shape of the antenna may be selected as appropriate in accordance with the wavelength of the carrier and the transmission method.

Power loss due to reflection of a radio wave can be suppressed by matching impedance between the interrogator and the antenna or the integrated circuit. The reactance corresponding to an imaginary part of impedance changes depending on the capacitance of the antenna, and therefore, it is preferable to design the shape of the antenna such that the antenna has predetermined capacitance in order to take the impedance matching. With the method for etching a conductive film described in Embodiment 1, for manufacturing the antenna of the RF tag, the shape of the antenna can be closer to a predetermined shape. Therefore, difference between the forecast capacitance of the antenna at the design phase and the actual capacitance of the antenna formed can be suppressed, so that impedance mismatching can be prevented and loss of power transmitted from the interrogator can be suppressed.

Figure 14:
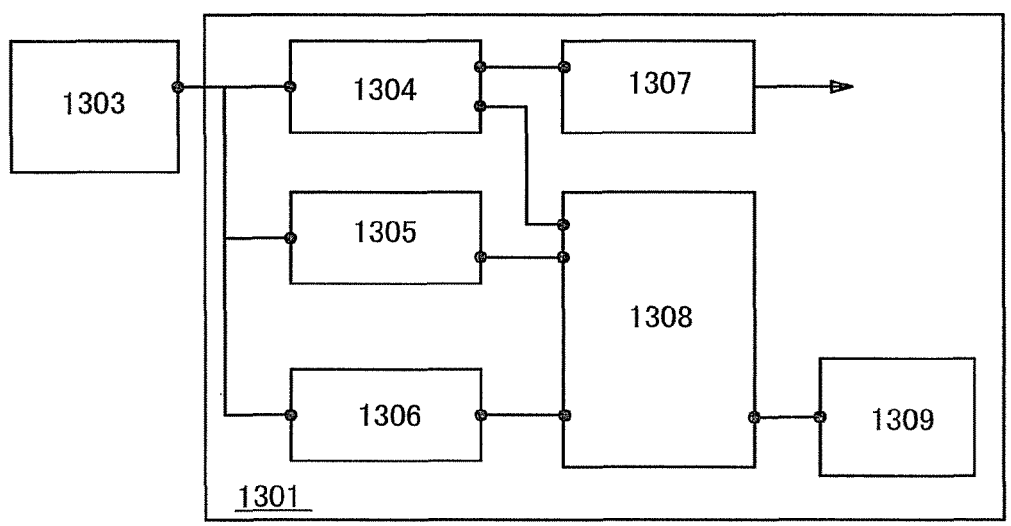
FIG. 14 is a block diagram of an RF tag.

Next, the structure of the integrated circuit included in the RF tag will be described. FIG. 14 is a block diagram illustrating one mode of the integrated circuit 1301 connected to the antenna 1303. The integrated circuit 1301 includes a power supply circuit 1304, a demodulating circuit 1305, a modulating circuit 1306, a regulator 1307, a control circuit 1308, and a memory 1309.

The antenna 1303 receives a radio wave transmitted from the interrogator to generate an alternating-current voltage. The power supply circuit 1304 rectifies the alternating-current voltage generated in the antenna 1303 to generate a voltage for power supply. The voltage for power supply, which is generated in the power supply circuit 1304, is supplied to the control circuit 1308 and the regulator 1307. The regulator 1307 stabilizes the voltage for power supply, which is generated from the power supply circuit 1304, or adjusts the level thereof, and supplies the voltage for power supply to the circuits in the integrated circuit 1301 such as the demodulating circuit 1305, the modulating circuit 1306, the control circuit 1308, and the memory 1309.

The demodulating circuit 1305 demodulates an alternating-current signal received by the antenna 1303 to output to the control circuit 1308 of the next stage. The control circuit 1308 performs arithmetic processing in accordance with the signal input from the demodulating circuit 1305 to generate another signal. When the arithmetic processing is performed, the memory 1309 can be used as a primary cache memory or a secondary cache memory. Further, the control circuit 1308 analyses the signal input from the demodulating circuit 1305, and in accordance with an instruction transmitted from the interrogator, outputs data in the memory 1309 or stores the instruction in the memory 1309. The signal output from the control circuit 1308 is encoded and transmitted to the modulating circuit 1306. In accordance with the signal, the modulating circuit 1306 applies an alternating-current voltage to the antenna 1303 to modulate the radio wave transmitted from the interrogator. The radio wave modulated in the antenna 1303 is received by the interrogator. There are various demodulation methods such as amplitude modulation, frequency modulation, and phase modulation depending on a standard; any modulation method can be used as long as it meets the standard.

The memory 1309 may be selected from either a nonvolatile memory or a volatile memory. As the memory 1309, a DRAM (dynamic random access memory), an SRAM (static random access memory), an FeRAM, a mask ROM, an EPROM (electrically programmable read only memory), an EEPROM (electrically erasable and programmable read only memory), a flash memory, an organic memory, or the like can be used.

The RF tag illustrated in FIG. 14 may be provided with an oscillation circuit, a primary battery, or a secondary battery.

Further, although FIG. 14 illustrates the structure of the RF tag in which the number of antennas electrically connected to the integrated circuit 1301 is one (the antenna 1303), the present invention is not limited to this structure. Two antennas for receiving power and for receiving signals may be electrically connected to the integrated circuit 1301. With the two antennas electrically connected to the integrated circuit, frequency of a radio wave for supplying power and frequency of a radio wave for transmitting a signal can be separately used.

This example can be combined with any of the above embodiments as appropriate to be implemented.

Example 2

In this example, a method for manufacturing a semiconductor device in which a semiconductor element is formed using a semiconductor film which is attached to a supporting substrate (a base substrate) from a semiconductor substrate (a bond substrate) will be described.

Figure 15A:
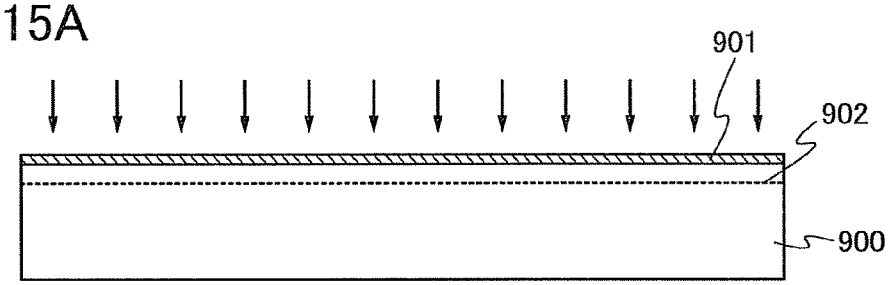
FIGS. 15A to 15D illustrate a manufacturing method of a semiconductor device, according to the embodiment of the present invention.

First, as shown in FIG. 15A, an insulating film 901 is formed over a bond substrate 900. The insulating film 901 is formed using an insulating material such as silicon oxide, silicon oxynitride, silicon nitride oxide, or silicon nitride. The insulating film 901 can be either a single insulating film or a stack insulating film in which a plurality of insulating films is stacked. For example, in this example, the insulating film 901 is used in which silicon oxynitride which contains more amount of oxygen than nitrogen and silicon nitride oxide which contains more amount of nitrogen than oxygen are deposited in this order on the bond substrate 900.

For example, in the case of using silicon oxide as the insulating film 901, the insulating film 901 can be formed using a mixed gas of silane and oxygen, a mixed gas of TEOS (tetraethoxysilane) and oxygen, or the like by a vapor deposition method such as a thermal CVD method, a plasma CVD method, an atmospheric pressure CVD method, or a bias ECR-CVD method. In this case, the surface of the insulating film 901 may be densified with oxygen plasma treatment. In the case of using silicon nitride as the insulating film 901, the insulating film 901 can be formed using a mixed gas of silane and ammonium by a vapor deposition method such as a plasma CVD method. In addition, in the case of using silicon oxynitride or silicon nitride oxide as the insulating film 901, the insulating film 901 can be formed using a mixed gas of silane and ammonium or a mixed gas of silane and nitrogen oxide by a vapor deposition method such as a plasma CVD method.

Alternatively, the insulating film 901 may be formed using silicon oxide which is deposited using an organosilane gas by a chemical vapor deposition method. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, as shown in FIG. 15A, the bond substrate 900 is irradiated with hydrogen or a rare gas, or hydrogen ions or rare gas ions as indicated by arrows so that a fragile layer 902 having microvoids is formed at a predetermined depth from the surface of the bond substrate 900. The depth in the bond substrate 900 where the fragile layer 902 is formed is determined depending on acceleration voltage of hydrogen at the time of the above-described irradiation. The thickness of a semiconductor film 908 which is attached from the bond substrate 900 to the base substrate 904 is determined by the depth of the fragile layer 902 in the bond substrate 900; therefore, acceleration voltage of hydrogen at the time of the irradiation is determined in consideration of the thickness of the semiconductor film 908. The semiconductor film 908 is formed having a thickness of 10 to 200 nm, preferably 10 to 50 nm. For example, in the case where the bond substrate 900 is irradiated with hydrogen, the dose is preferably set at $1 \times 10^{16}$ to $1 \times 10^{17}/cm^2$.

Note that, in the step of forming the fragile layer 902, the bond substrate 900 is irradiated with hydrogen or a rare gas, or hydrogen ions or rare gas ions at a high concentration, and accordingly the surface of the bond substrate 900 becomes rough and sufficient bond strength for attachment to the base substrate 904 cannot be obtained in some cases. With the provision of the insulating film 901, the surface of the bond substrate 900 is protected at the time of the irradiation with hydrogen or a rare gas, or hydrogen ions or rare gas ions, and the base substrate 904 and the bond substrate 900 can be bonded to each other well.

Figure 15B:
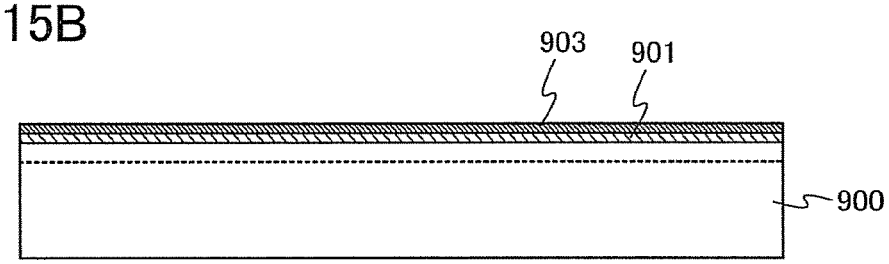

Next, as shown in FIG. 15B, an insulating film 903 is formed over the insulating film 901. As is in the case of forming the insulating film 901, the insulating film 903 is formed using an insulating material such as silicon oxide, silicon oxynitride, silicon nitride oxide, or silicon nitride. The insulating film 903 can be either a single insulating film or a stack insulating film in which a plurality of insulating films is stacked. Alternatively, the insulating film 903 may be formed using silicon oxide which is deposited using an organosilane gas by a chemical vapor deposition method. In this example, the insulating film 903 is formed using the silicon oxide which is deposited using an organosilane gas by a chemical vapor deposition method.

When an insulating film having a high barrier property to diffusion of an impurity, such as a silicon nitride film or a silicon nitride oxide film is used as the insulating film 901 or the insulating film 903, impurities such as alkali metal or alkaline earth metal included in the base substrate 904 can be prevented from diffusing a semiconductor film 909 later formed.

Although the insulating film 903 is formed after the fragile layer 902 is formed in this example, the insulating film 903 is not necessarily provided. However, since the insulating film 903 is formed after the formation of the fragile layer 902, the insulating film 903 has a smoother surface than the insulating film 901 formed before the formation of the fragile layer 902. Therefore, with the insulating film 903, the bond strength of attachment later performed can be improved.

Next, before the bond substrate 900 and the base substrate 904 are attached to each other, hydrogenation treatment may be performed on the bond substrate 900. The hydrogenation treatment is performed, for example, at 350° C. for about 2 hours in a hydrogen atmosphere.

Figure 15C:
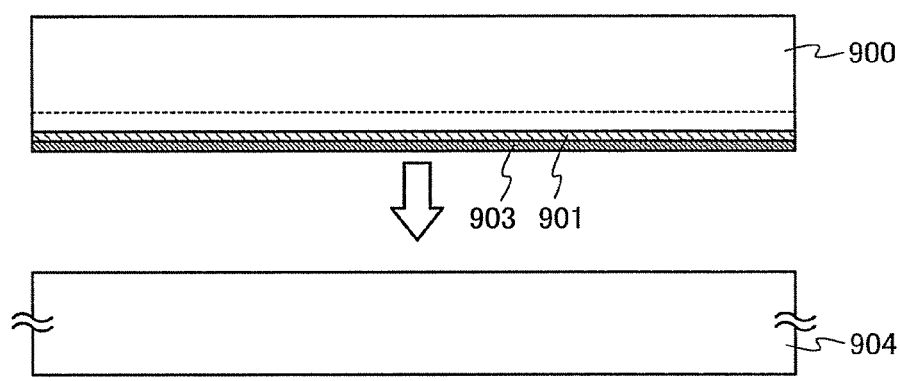
Figure 15D:
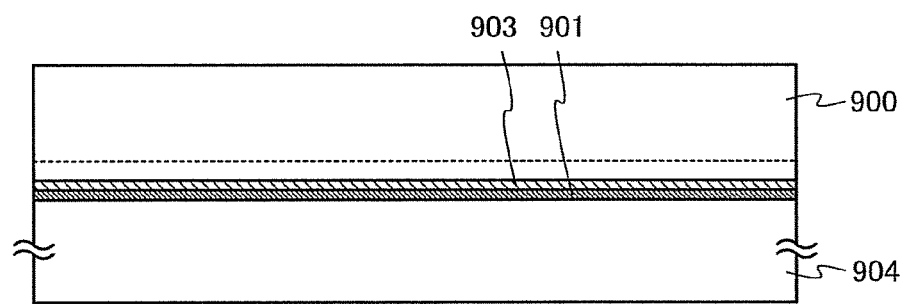

Next, the bond substrate 900 is stacked over the base substrate 904 so that the insulating film 903 is interposed therebetween as shown in FIG. 15C, thereby attaching the substrates to each other as shown in FIG. 15D. The insulating film 903 is attached to the base substrate 904, whereby the bond substrate 900 and the base substrate 904 can be attached to each other.

Specifically, the base substrate 904 and the insulating film 903 are disposed so as to face each other and pressed lightly at one portion of the base substrate 904 or the bond substrate from the outside, so that the distance between the opposed surfaces for attachment thereof is locally decreased, which leads to attraction between the base substrate 904 and the insulating film 903 due to Van der Waals' forces and hydrogen bonding. Further, the distance between the opposed substrates is decreased also in the region adjacent to the point, so that the region where Van der Waals' forces strongly act or the region where hydrogen bonding occurs spreads out with progress of bonding of the opposed substrates, which results in bonding over the entire region where the base substrate 904 and the insulating film 903 are attached each other. The above-described attachment can be performed at a low temperature, and therefore, various substrates can be used for the base substrate 904. As the base substrate 904, a quartz substrate, a sapphire substrate, or the like can be used as well as a glass substrate made of aluminosilicate glass, barium borosilicate glass, aluminoborosilicate glass, or the like. Alternatively, as the base substrate 904, a semiconductor substrate made of silicon, gallium arsenide, indium phosphide, or the like can be used.

Note that an insulating film may also be formed on the surface of the base substrate 904 and the insulating film may be attached to the insulating film 903. In this case, as the base substrate 904, a metal substrate such as a stainless-steel substrate can be used as well as the above-described substrates. A substrate made of a synthetic resin which has flexibility such as plastic has generally a lower allowable temperature limit than the above-described substrates; however, the substrate can be used as the base substrate 904 as long as it can resist the processing temperature in the manufacturing process. As examples of a plastic substrate, the following can be given: polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

As the bond substrate 900, a single crystal semiconductor substrate or a polycrystalline semiconductor substrate made of silicon, germanium, or the like can be used. Alternatively, a single crystal semiconductor substrate formed using a compound semiconductor such as gallium arsenide or indium phosphide can be used as the bond substrate 900. Further alternatively, as the bond substrate 900, a semiconductor substrate made of silicon having lattice distortion, silicon germanium in which germanium is added to silicon, or the like may be used. Silicon having lattice distortion can be formed by formation of silicon on silicon germanium or silicon nitride which has a larger lattice constant than silicon.

Note that heat treatment or pressure treatment may be performed after the base substrate 904 and the bond substrate 900 are attached to each other. The bonding strength for attachment can be improved with the heat treatment or the pressure treatment.

Figure 16A:
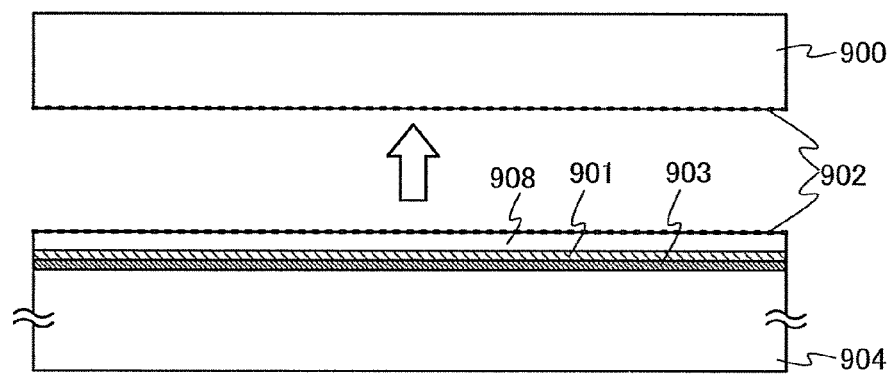
FIGS. 16A to 16C illustrate the manufacturing method of the semiconductor device, according to the embodiment of the present invention

After the above-described attachment, thermal treatment is performed so that the microvoids in the fragile layer 902 are bonded to each other and the volumes of the microvoids increase. As a result, the semiconductor film 908 which is one part of the bond substrate 900 is separated from the other part of the bond substrate 900, in the fragile layer 902 as shown in FIG. 16A. The thermal treatment is preferably preformed at a temperature which is equal to or less than the allowable temperature limit of the base substrate 904. For example, the thermal treatment may be performed at a temperature ranging from 400° C. to 600° C. Through this separation, the semiconductor film 908 in addition to the insulating films 901 and 903 is attached to the base substrate 904. After that, thermal treatment at a temperature ranging from 400° C. to 600° C. is preferably performed in order to attach the insulating film 903 and the base substrate 904 to each other more strongly.

Crystal orientation of the semiconductor film 908 can be controlled with the surface orientation of the bond substrate 900. The bond substrate 900 having surface orientation which is suitable for a semiconductor element to be formed may be selected as appropriate. Field-effect mobility of a transistor differs depending on the surface orientation of the semiconductor film 908. In order to form a transistor with a higher filed-effect mobility, the direction of the attached bond substrate 900 is set in consideration of the direction of a channel and the surface orientation.

Next, the surface of the semiconductor film 908 attached is smoothed. Although the smoothing is not necessarily performed, the smoothing makes it possible to improve characteristics of the interface between the semiconductor film 908 and a gate insulating film in the transistor later formed. Specifically, the smoothing can be performed by chemical mechanical polishing (CMP), liquid jet polishing, or the like. The thickness of the semiconductor film 908 is reduced by the above-described smoothing.

Although Smart Cut (registered trademark) method is used in the case where the semiconductor film 908 is separated from the bond substrate 900 by using the fragile layer 902 in this example, the semiconductor film 908 may be attached to the base substrate 904 by another bonding method such as ELTRAN (epitaxial layer transfer), a dielectric isolation method, or a PACE (plasma assisted chemical etching) method.

Figure 16B:
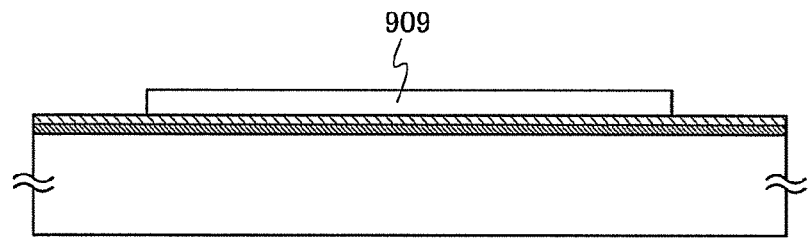

Next, as shown in FIG. 16B, the semiconductor film 908 is processed (patterned) into a predetermined shape, so that an island-shaped semiconductor film 909 is formed.

Figure 16C:
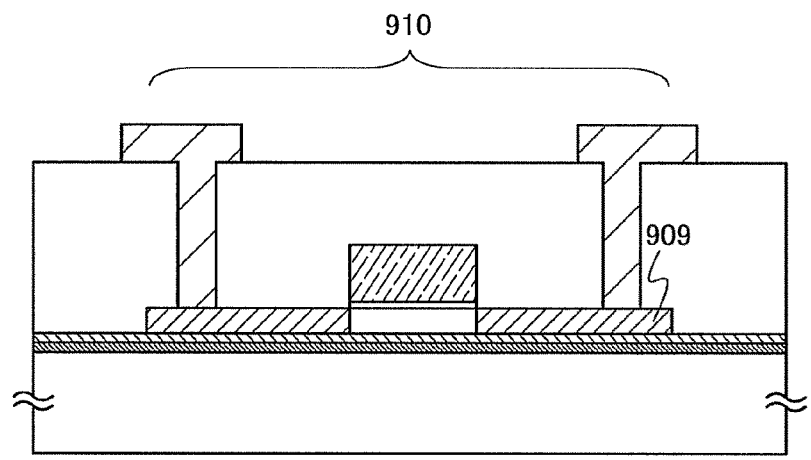

With the use of the semiconductor film 909 which is formed through the above-described process, various semiconductor elements such as a transistor can be formed. FIG. 16C illustrates a transistor 910 formed using the semiconductor film 909.

With the above-described manufacturing method, a semiconductor element can be manufactured.

This example can be combined with any of the above embodiments and example as appropriate to be implemented.

Example 3

In an RF tag manufactured by the method for manufacturing a conductive film described in Embodiment 1, the resistance of an antenna can be suppressed and it is easy to take impedance matching so that loss of power transmitted from an interrogator can be suppressed. Therefore, in the case of the RF tag according to the method for manufacturing a conductive film described in Embodiment 1, an integrated circuit can be highly functionalized or communication distance can be increased; thus, usage for the RF tag is increased.

Further, when an integrated circuit in the RF tag includes a memory such as a ROM unable to rewrite a data, counterfeiting of an object to which the RF tag is attached can be prevented. Therefore, for example, with respect to the foods whose commercial value depends largely on a production area, a producer, and the like, the RF tag formed using the method for manufacturing a conductive film described in Embodiment 1 is useful in preventing forgery of production area, a producer, and the like.

Specifically, the RF tag according to the method for manufacturing a conductive film described in Embodiment 1 can be used by attaching to a tag having data on an object, such as a baggage tag, a price tag, or a name tag. Further, the RF tag formed using the method for manufacturing a conductive film described in Embodiment 1 may be used itself as a tag. Further, the RF tag formed using the method for manufacturing a conductive film described in Embodiment 1 can be attached to a certificate corresponding to a document stating the truth, such as a family register, a resident card, a passport, a driving license, an identification card, a membership card, a survey report, a credit card, a cash card, a prepaid card, a patient's registration card, and a commuter pass. Further, the RF tag formed using the method for manufacturing a conductive film described in Embodiment 1 can be attached to securities corresponding to securities stating private property rights, such as a bill of exchange, a check, a receipt note, a bill of lading, a warehouse receipt, a stock, a bond, a gift certificate, and a mortgage certificate.

Further, for example, the RF tag formed using the method for manufacturing a conductive film described in Embodiment 1 may be attached to a label of an article to perform distribution management of the article by using the RF tag.

Figure 17A:
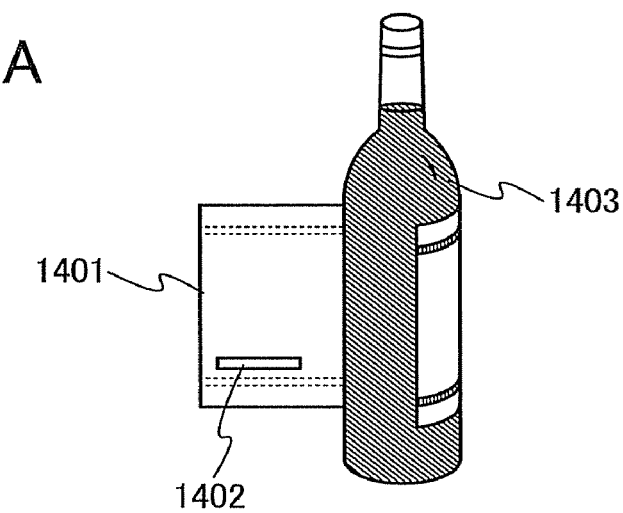
FIGS. 17A to 17C are views each of an application mode of an RF tag.

Further, for example, as shown in FIG. 17A, an RF tag 1402 formed using the method for manufacturing a conductive film described in Embodiment 1 is attached to a supporting object such as a past-on label 1401 of an article. The label 1401 to which the RF tag 1402 is attached is put on an article 1403. Identification data on the article 1403 can be read wirelessly from the RF tag 1402 attached to the label 1401. In this manner, the RF tag 1402 facilitates article management in the distribution process.

For example, in the case where a nonvolatile memory capable of writing is used as a memory of an integrated circuit in the RF tag 1402, the distribution process of the article 1403 can be recorded. In addition, with the recorded production process of the article, a wholesaler, a retailer, and a consumer can easily find out the production area, the producer, the date of manufacture, the processing method, and the like.

Figure 17B:
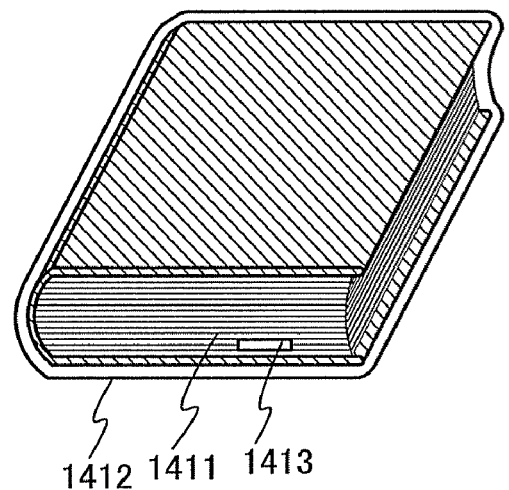

In the case of articles having value on their contained data, for example, books, DVDs, and CDs, there is a problem in that disclosure of total data contained in the articles lowers their value as articles whereas veiling data completely makes it difficult to grasp their value as articles. By wrapping the above articles each with a wrapping material to which the RF tag formed using the method for manufacturing a conductive film described in Embodiment 1 is attached, and then storing part of data contained in the article, in the RF tag, customers can grasp value of the article without lowering value of the article. FIG. 17B illustrates a book 1411 which is wrapped with a wrapping material 1412 to which an RF tag 1413 formed using the method for manufacturing a conductive film described in Embodiment 1 is attached.

Then, for example, with the use of a portable information terminal like a mobile phone, to which a function as an interrogator is added, customers can grasp the contents of the book 1411.

According to the above structure, customers can grasp the contents of articles without disclosing all data included in the articles.

Figure 17C:
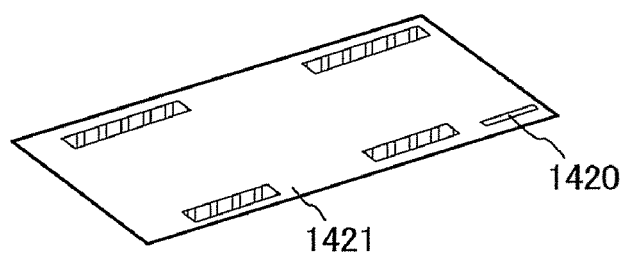

FIG. 17C illustrates a bearer bond 1421 to which an RF tag 1420 formed using the method for manufacturing a conductive film described in Embodiment 1 is attached. The bearer bond 1421 includes in its category a stamp, a ticket, an admission ticket, a gift certificate, a book coupon, a stationery coupon, a beer coupon, a rice coupon, various gift coupons, various service coupons, and the like. The RF tag 1420 may be put inside the bearer bond 1421, or exposed outside the bearer bond 1421. The RF tag formed using the method for manufacturing a conductive film described in Embodiment 1 has advantages of being resistant to destruction due to stress and being resistant to destruction due to static electricity caused by friction.

This example can be combined with any of the above embodiments and examples as appropriate to be implemented.

The present application is based on Japanese Patent Application serial No. 2008-085288 filed with Japan Patent Office on Mar. 28, 2008, the entire contents of which are hereby incorporated by reference.

What is claimed is:

1. A method for manufacturing a semiconductor device, comprising the steps of:
   forming an insulating film;
   forming a conductive film over the insulating film, the conductive film containing aluminum and having an initial thickness equal to or greater than 1 µm and equal to or less than 10 µm;
   forming a mask having an opening over the conductive film;
   etching the conductive film in the opening by wet-etching such that the conductive film in the opening remains with a thickness equal to or greater than 0.5 µm and equal to or less than 5 µm; and
   etching the conductive film in the opening by dry-etching after the wet-etching so that the insulating film is exposed in the opening.

2. The method according to claim 1, wherein the conductive film is formed so that the initial thickness is equal to or greater than 2 µm and equal to or less than 6 µm.

3. The method according to claim 1, wherein the conductive film is formed by a sputtering method.

4. The method according to claim 1, wherein the mask is formed so that a thickness thereof is equal to or greater than 2.5 µm and equal to or less than 3 µm.

5. A method for manufacturing a semiconductor device, comprising the steps of:
   forming an insulating film over an integrated circuit;
   forming a conductive film over the insulating film, the conductive film containing aluminum and having an initial thickness equal to or greater than 1 µm and equal to or less than 10 µm;
   forming a mask having an opening over the conductive film;
   etching the conductive film in the opening by wet-etching such that the conductive film in the opening remains with a thickness equal to or greater than 0.5 µm and equal to or less than 90 percent of the initial thickness; and
   etching the conductive film in the opening by dry-etching after the wet-etching so that the insulating film is exposed in the opening.

6. The method according to claim 5, wherein the conductive film is formed so that the initial thickness is equal to or greater than 2 µm and equal to or less than 6 µm.

7. The method according to claim 5, wherein the conductive film is formed by a sputtering method.

8. The method according to claim 5, wherein the mask is formed so that a thickness thereof is equal to or greater than 2.5 µm and equal to or less than 3 µm.

* * * * *